(12) United States Patent
Morita et al.

(10) Patent No.: US 11,474,300 B2
(45) Date of Patent: Oct. 18, 2022

(54) OPTICAL COMMUNICATION CONNECTOR, OPTICAL TRANSMITTER, OPTICAL RECEIVER, OPTICAL COMMUNICATION SYSTEM, AND OPTICAL COMMUNICATION CABLE

(71) Applicant: SONY CORPORATION, Tokyo (JP)

(72) Inventors: Hiroshi Morita, Kanagawa (JP); Kazuaki Toba, Kanagawa (JP); Masanari Yamamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 17/047,161

(22) PCT Filed: Mar. 11, 2019

(86) PCT No.: PCT/JP2019/009592
§ 371 (c)(1),
(2) Date: Oct. 13, 2020

(87) PCT Pub. No.: WO2019/207976
PCT Pub. Date: Oct. 31, 2019

(65) Prior Publication Data
US 2021/0124123 A1 Apr. 29, 2021

(30) Foreign Application Priority Data
Apr. 26, 2018 (JP) .............................. JP2018-085421

(51) Int. Cl.
*G02B 6/32* (2006.01)
*H01S 5/0239* (2021.01)
(Continued)

(52) U.S. Cl.
CPC ............. *G02B 6/325* (2013.01); *G02B 6/262* (2013.01); *H01L 31/02019* (2013.01);
(Continued)

(58) Field of Classification Search
CPC ..................................................... G02B 6/325
See application file for complete search history.

(56) References Cited

U.S. PATENT DOCUMENTS 4,929,070 A * 5/1990 Yokota ............... A61B 1/00096
385/33
6,850,666 B2 * 2/2005 Hikichi .................. G02B 6/262
385/31
(Continued)

FOREIGN PATENT DOCUMENTS

CA 2448199 A1 11/2002
CN 104105990 A 10/2014
(Continued)

OTHER PUBLICATIONS

International Search Report and Written Opinion of PCT Application No. PCT/JP2019/009592, dated Apr. 9, 2019, 10 pages of ISRWO.

(Continued)

Primary Examiner — Rhonda S Peace
(74) Attorney, Agent, or Firm — Chip Law Group

(57) ABSTRACT

To provide an optical communication connector, an optical transmitter, an optical receiver, an optical communication system, and an optical communication cable that make it possible to prevent reduction in communication quality at low cost. An optical communication connector according to the present technology is capable of spatial optical coupling, and the optical communication connector includes a first lens and a second lens. The first lens magnifies light emitted from a light emitter. The second lens shapes light incident from the first lens and outputs the shaped light.

16 Claims, 20 Drawing Sheets

(51) Int. Cl.
  *H01S 5/02253* (2021.01)
  *H01S 5/02251* (2021.01)
  *G02B 6/26* (2006.01)
  *H01L 31/02* (2006.01)

(52) U.S. Cl.
  CPC ........ *H01S 5/0239* (2021.01); *H01S 5/02251* (2021.01); *H01S 5/02253* (2021.01)

(56) References Cited

U.S. PATENT DOCUMENTS

| | | | |
|---|---|---|---|
| 7,236,665 B2* | 6/2007 | Kobayashi | G02B 6/32 385/119 |
| 7,510,337 B2* | 3/2009 | Takeda | G02B 6/3861 385/65 |
| 7,985,026 B1* | 7/2011 | Lin | G02B 6/32 385/71 |
| 8,406,588 B2* | 3/2013 | Matsui | G02B 6/3825 385/51 |
| 9,025,917 B2* | 5/2015 | Aoki | G02B 6/32 385/33 |
| 9,739,948 B2* | 8/2017 | Watanabe | G02B 6/32 |
| 9,983,365 B2* | 5/2018 | Childers | G02B 6/3853 |
| 10,139,566 B2* | 11/2018 | Kase | G02B 6/3853 |
| 10,436,989 B2* | 10/2019 | Yakabe | G02B 6/32 |
| 2004/0165822 A1 | 8/2004 | Kobayashi et al. | |
| 2010/0284651 A1* | 11/2010 | Krahenbuhl | G02B 6/3885 385/35 |
| 2013/0071063 A1 | 3/2013 | Aoki et al. | |
| 2016/0320569 A1 | 11/2016 | Fortusini et al. | |
| 2021/0124123 A1* | 4/2021 | Morita | G02B 6/3839 |
| 2021/0181424 A1* | 6/2021 | Morita | G02B 6/387 |

FOREIGN PATENT DOCUMENTS

| | | |
|---|---|---|
| CN | 106068474 A | 11/2016 |
| CN | 107690593 A | 2/2018 |
| EP | 0032722 A1 | 7/1981 |
| EP | 1413905 A1 | 4/2004 |
| EP | 3289397 A1 | 3/2018 |
| JP | 60-161309 U | 10/1985 |
| JP | 2002-350674 A | 12/2002 |
| JP | 2004-302292 A | 10/2004 |
| JP | 2011-164182 A | 8/2011 |
| JP | 6401888 B1 | 10/2018 |
| WO | 2002/095465 A1 | 11/2002 |
| WO | 2016/178884 A1 | 11/2016 |

OTHER PUBLICATIONS

Office Action for CN Patent Application No. 201980026901.9, dated Jun. 16, 2022, 14 pages of English Translation and 12 pages of Office Action.

* cited by examiner

OPTICAL COMMUNICATION CONNECTOR, OPTICAL TRANSMITTER, OPTICAL RECEIVER, OPTICAL COMMUNICATION SYSTEM, AND OPTICAL COMMUNICATION CABLE

CROSS REFERENCE TO RELATED APPLICATIONS

This application is a U.S. National Phase of International Patent Application No. PCT/JP2019/009592 filed on Mar. 11, 2019, which claims priority benefit of Japanese Patent Application No. JP 2018-085421 filed in the Japan Patent Office on Apr. 26, 2018. Each of the above-referenced applications is hereby incorporated herein by reference in its entirety.

TECHNICAL FIELD

The present technology relates to an optical communication connector, an optical transmitter, an optical receiver, an optical communication system, and an optical communication cable that are used for optical communication.

BACKGROUND ART

Structures including a light-transmissive member to which an optical fiber is connected and a lens provided on the light-transmissive member have been widely used as optical communication connectors for optical communication. Light emitted from the optical fiber passes through the light-transmissive member, gets collimated by the lens, and is output from the optical communication connector.

The collimated light enters a mating optical communication connector and gets collected at an optical fiber, and an optical signal is transmitted. Here, collimated light having a small diameter impairs communication because the collimated light is blocked when a foreign substance such as dust is interposed between the optical communication connectors. Therefore, collimated light having a large diameter is suitable.

To increase the diameter of the collimated light, it is sufficient to lengthen a distance between the optical fiber and the lens. However, when the distance between the optical fiber and the lens is lengthened, a distance between the optical fiber and the mating optical fiber is also lengthened. Therefore, in the case where there is a gap in angles of the optical fibers with respect to an optical axis, there is a possibility that light emitted from the optical communication connector is collected at a position different from the mating optical fiber and the light does not enter the mating optical fiber.

This issue becomes particularly problematic in the case of a single-mode fiber that has a smaller numerical aperture (NA) and a smaller emission angle of light emitted from the optical fiber than a multi-mode fiber.

With regard to this problem, Patent Literature 1 discloses an optical fiber terminal in which a coreless fiber is joined to an end of an optical fiber and a concave part is provided at a terminal end thereof. Such a configuration makes it possible to allow light emitted from the optical fiber to pass through the coreless fiber and allow the concave part to magnify the light.

CITATION LIST

Patent Literature

Patent Literature 1: JP 2004-302292A

DISCLOSURE OF INVENTION

Technical Problem

However, when using the configuration described in Patent Literature 1, it is necessary to join the coreless fiber to each optical fiber, and this results in increase in cost. In particular, when the number of channels of optical communication increases, it is necessary to perform a junction process on each of the plurality of optical fibers, and this results in significant increase in cost.

In view of the circumstances as described above, a purpose of the present technology is to provide an optical communication connector, an optical transmitter, an optical receiver, an optical communication system, and an optical communication cable that make it possible to prevent reduction in communication quality at low cost.

Solution to Problem

In order to achieve the above-described purpose, an optical communication connector according to the present technology is capable of spatial optical coupling, and the optical communication connector includes a first lens and a second lens.

The first lens magnifies light emitted from a light emitter.

The second lens shapes light incident from the first lens and outputs the shaped light.

According to such a configuration, the first lens magnifies the light emitted from the light emitter and the second lens shapes the magnified light. This makes it possible to enlarge the diameter of the light output from the second lens even when the distance between the light emitter and the second lens is short. The short distance between the light emitter and the second lens makes it possible to prevent effects of misalignment of the light emitter on optical communication and it is also possible to improve tolerance to foreign substance inclusion by enlarging the diameter of the light.

The second lens may shape the light output from the first lens into collimated light.

The optical communication connector may further include a connector main body that defines relative positions of the light emitter, the first lens, and the second lens.

The light emitter may be an optical fiber, the connector main body may have a hole into which the optical fiber is inserted, and the optical fiber may be fixed to the connector main body with an adhesive injected in the hole.

The light emitter may be a light-emitting element.

The connector main body may include a first part to which the light emitter is fixed and a second part that includes the second lens.

The first lens may be a concave lens that has a concave shape and that is provided on a junction surface of the first part with the second part, and the second lens may be a convex lens that has a convex shape and that is provided on a side of the second part opposite to the first part.

The first lens may be a concave lens that has a concave shape and that is provided on a junction surface of the second part with the first part, and the second lens may be a convex lens that has a convex shape and that is provided on a side of the second part opposite to the first part.

The first lens may be a concave lens that has a concave shape and that is provided on a junction surface of the first part with the second part, the second lens may be a convex lens that has a convex shape and that is provided on a side of the second part opposite to the first part, and the optical communication connector may further includes a third lens that has a concave shape and that is provided on a junction surface of the second part with the first part, the third lens magnifying the light incident from the first lens and outputting the magnified light to the second lens.

The optical communication connector may further include a third part that is disposed between the first part and the second part and that includes a third lens and a fourth lens, the third lens magnifying the light incident from the first lens, the fourth lens magnifying light incident from the third lens, the second part may further include a fifth lens that magnifies light incident from the fourth lens and outputs the magnified light to the second lens, the first lens may be a concave lens that has a concave shape and that is provided on a junction surface of the first part with the third part, the second lens may be a convex lens that has a convex shape and that is provided on a side of the second part opposite to the third part, the third lens may be a concave lens that has a concave shape and that is provided on a junction surface of the third part with the first part, the fourth lens may be a concave lens that has a concave shape and that is provided on a junction surface of the third part with the second part, and the fifth lens may be a concave lens that has a concave shape and that is provided on a junction surface of the second part with the third part.

The first lens may be a concave lens that has a concave shape and that is provided on a tip of the hole, and the second lens may be a convex lens that has a convex shape and that is provided on the connector main body.

The optical communication connector may further includes a contact surface that is provided on the tip of the hole near the first lens, and that is brought into contact with the optical fiber.

The optical communication connector may further include:

a fixed member into which the optical fiber is inserted; and a contact surface that is provided on the tip of the hole near the first lens, and that is brought into contact with the fixed member.

The connector main body may include a reflector that reflects the light emitted from the light emitter toward the first lens.

The second part may seal a concave part constituting the first lens.

In order to achieve the above-described purpose, an optical communication connector according to the present technology is capable of spatial optical coupling, and the optical communication connector includes a first lens and a second lens.

The first lens collects shaped incident light.

The second lens that collects light incident from the first lens at a light receiver.

In order to achieve the above-described purpose, an optical transmitter according to the present technology includes a light emitter and an optical communication connector.

The optical communication connector is capable of spatial optical coupling, the optical communication connector including a first lens that magnifies light emitted from a light emitter, and a second lens that shapes light incident from the first lens and outputs the shaped light.

In order to achieve the above-described purpose, an optical receiver according to the present technology includes a light receiver and an optical communication connector.

The optical communication connector is capable of spatial optical coupling, the optical communication connector including a first lens that collects shaped incident light, and a second lens that collects light incident from the first lens at the light receiver.

In order to achieve the above-described purpose, an optical communication system according to the present technology includes a first optical communication connector and a second optical communication connector.

The first optical communication connector is capable of spatial optical coupling, the first optical communication connector including a first lens that magnifies light emitted from a light emitter, and a second lens that shapes light incident from the first lens and outputs the shaped light.

The second optical communication connector is detachable and attachable from and to the first optical connector and is capable of spatial optical coupling, the second optical communication connector including a third lens that collects light incident from the second lens, and a fourth lens that collects light incident from the third lens at a light receiver.

In order to achieve the above-described purpose, an optical communication cable includes an optical fiber, a first optical communication connector, and a second optical communication connector.

The first optical communication connector is capable of spatial optical coupling, the first optical communication connector including a first lens on which shaped light is incident, and a second lens that collects light incident from the first lens at the optical fiber.

The second optical communication connector is capable of spatial optical coupling, the second optical communication connector including a third lens that magnifies light incident from the optical fiber, and a fourth lens that shapes light incident from the third lens, and outputs the shaped light.

As described above, according to the present technology, it is possible to provide the optical communication connector, the optical transmitter, the optical receiver, the optical communication system, and the optical communication cable that make it possible to prevent reduction in communication quality at low cost.

MODE(S) FOR CARRYING OUT THE INVENTION

First Embodiment

An optical communication connector according to a first embodiment of the present technology will be described.

Figure 1:
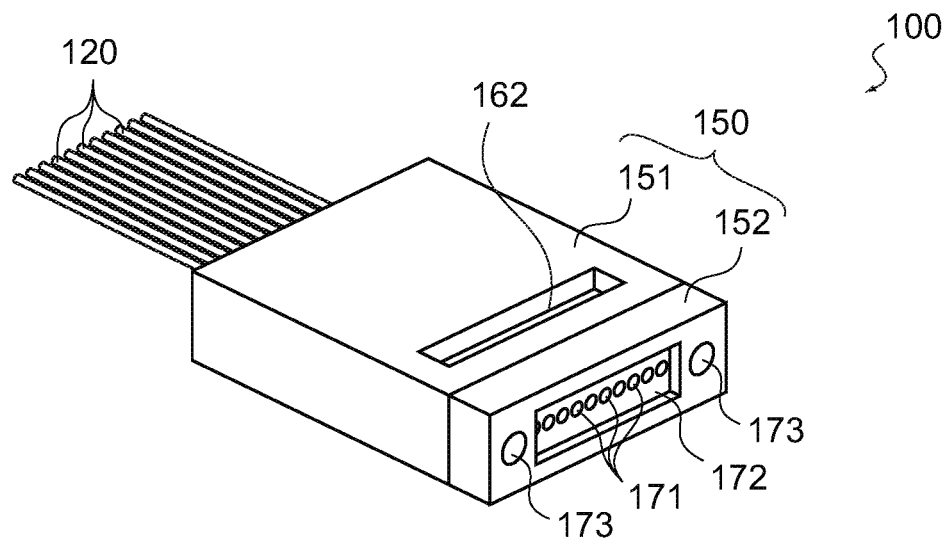
FIG. 1 is a perspective view of an optical communication connector according to a first embodiment of the present technology.
Figure 2:
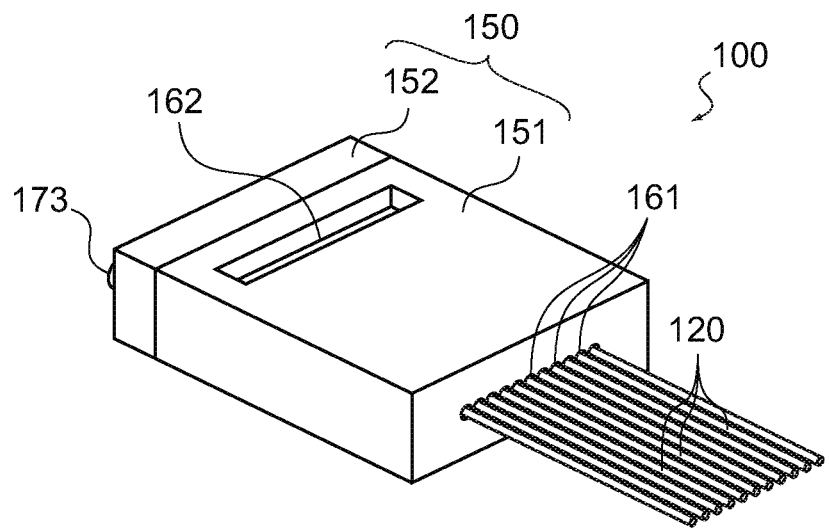
FIG. 2 is a perspective view of the optical communication connector.

FIG. 1 and FIG. 2 are perspective views of an optical communication connector 100 according to the present embodiment when viewed from opposite directions. As illustrated in FIG. 1 and FIG. 2, a plurality of optical fibers 100 is connected to the optical communication connector 100. Alternatively, the number of optical fibers connected to the optical communication connector 100 may be one.

Figure 3:
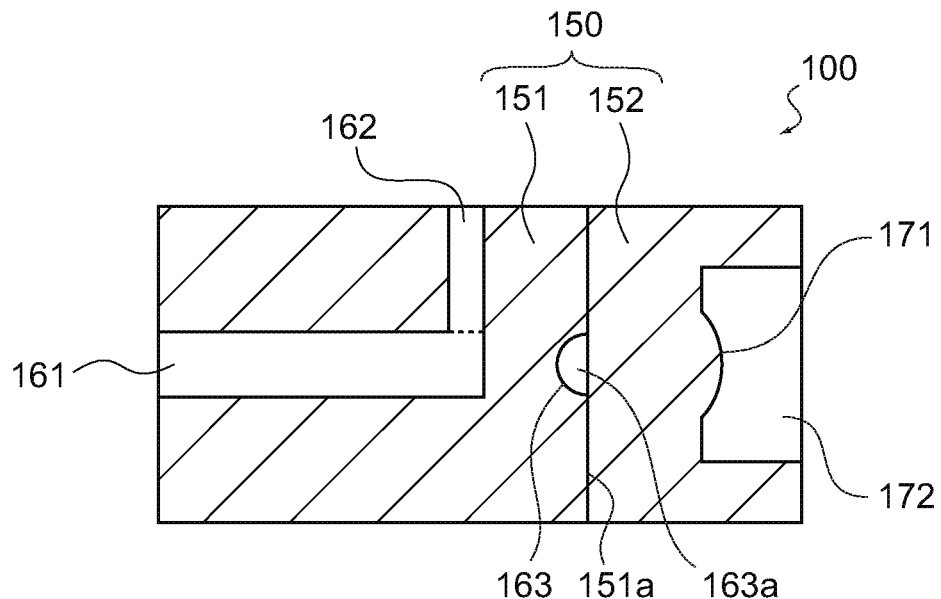
FIG. 3 is a cross-sectional view of the optical communication connector.
Figure 4:
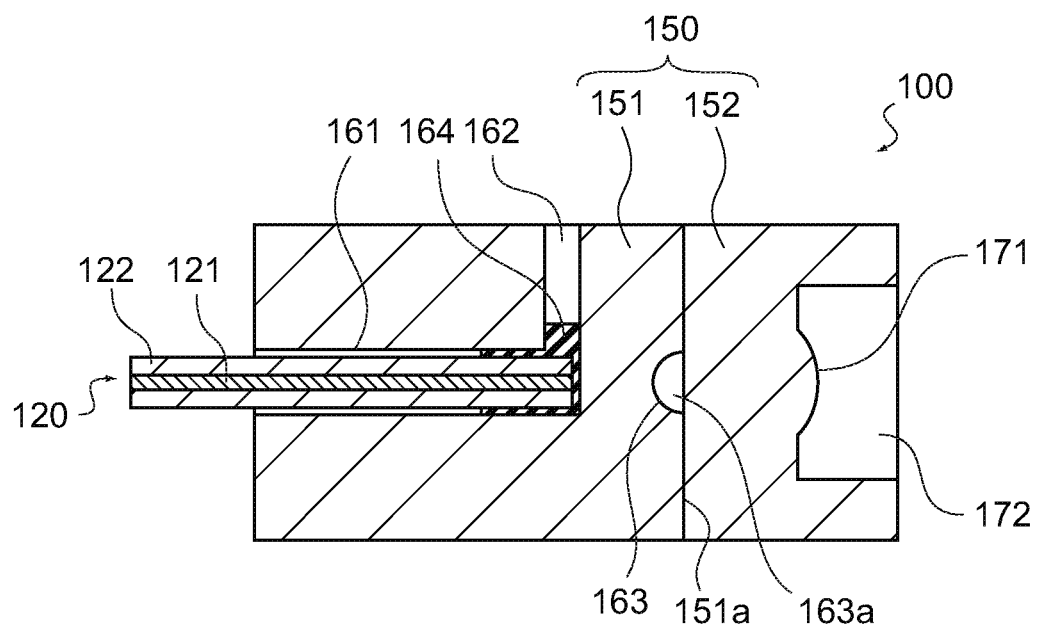
FIG. 4 is a cross-sectional view of the optical communication connector and an optical fiber.

FIG. 3 is a cross-sectional view of the optical communication connector 100, and FIG. 4 is a cross-sectional view of the optical communication connector 100 connected to optical fibers 120. As illustrated in FIG. 4, the optical fiber 120 includes a core 121 and cladding 122. The optical fiber 120 may be a single-mode fiber or a multi-mode fiber.

As illustrated in FIG. 3, the optical communication connector 100 includes a connector main body 150, and the connector main body 150 includes a first part 151 and a second part 152.

The first part 151 has optical fiber insertion holes 161, an adhesive injection hole 162, and includes first lenses 163. The first part 151 includes light-transmissive material such as glass or synthetic resin. Alternatively, the first part 151 may be silicon material that is used as material for a microelectromechanical system (MEMS) and that is transparent to light of a specific wavelength.

As illustrated in FIG. 4, the optical fiber insertion hole 161 is a hole into which the optical fiber 120 is inserted, and the optical fiber insertion hole 161 extends from an end of the first part 151 opposite to the second part 152 to have a certain length.

As illustrated in FIG. 2, the optical fiber insertion hole 161 is made for each of the optical fibers 120. The optical fibers 120 are inserted into the respective optical fiber insertion holes 161, and are fixed to the first part with an adhesive 164 as illustrated in FIG. 4.

The adhesive injection hole 162 is a hole that communicates with the respective optical fiber insertion holes 161. The adhesive 164 is injected into the adhesive injection hole 162 and surrounds portions of the optical fibers 120.

The adhesive 164 is not specifically limited as long as the adhesive 164 is capable to fixing the optical fibers 120. However, a light-transmissive adhesive is suitable because the adhesive flows into a space between tips of the optical fiber insertion holes 161 and the optical fibers 120 as illustrated in FIG. 4. Note that, the adhesive 164 may be refractive index matching material. Note that, the adhesive 164 does not have to flow into the space between the tips of the optical fiber insertion holes 161 and the optical fibers 120.

Figure 5:
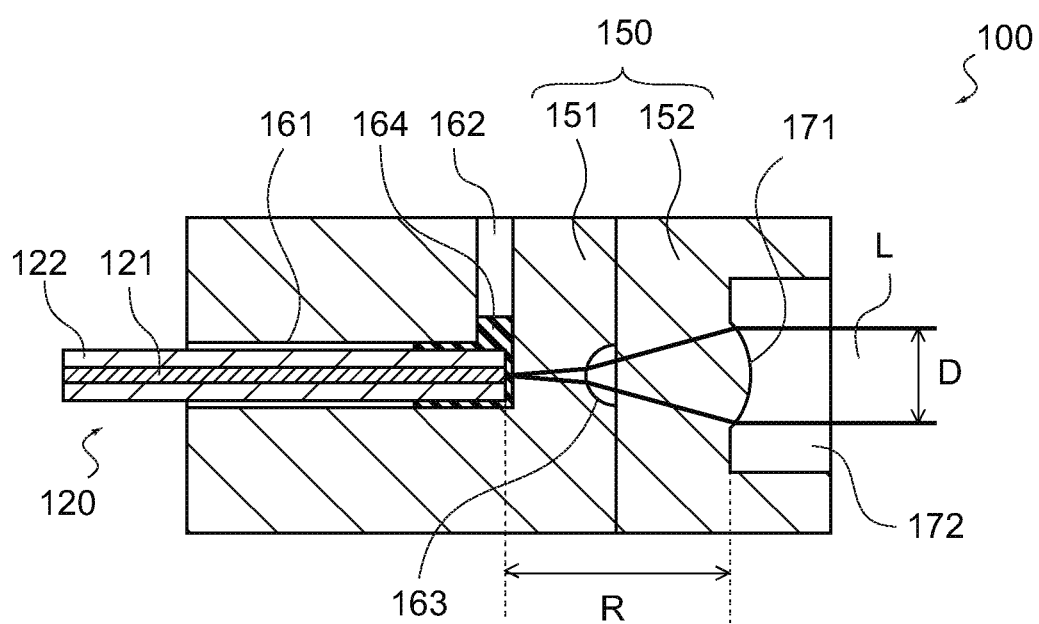
FIG. 5 is a schematic diagram illustrating an optical path in the optical communication connector.

The first lens 163 magnifies light emitted from the core 121 of the optical fiber 120. FIG. 5 is a schematic diagram illustrating a path of light L in the optical communication connector 100. As illustrated in FIG. 5, the light L emitted from the core 121 of the optical fiber 120 passes through the adhesive 164 and the first part 151 and enters the first lens 163, and then the first lens 163 magnifies the light L.

As illustrated in FIG. 4, the first lens 163 may be a concave lens that has a concave shape and that is provided on a junction surface 151a. The junction surface 151a is a junction surface of the first part 151 with the second part 152. The concave part constituting the first lens 163 is sealed with the second part 152, and this makes it possible to prevent inclusion of grit, dust, and the like.

The first lens 163 is provided for each of the optical fibers 120. The first lens 163 are arrayed in such a manner that optical axes of light emitted from the respective optical fibers 120 are identical to centers of the respective first lenses 163.

The second part 152 is joined to the first part 151, and the second part 152 includes second lenses 171, a light transmission space 172, and connection parts 173 (see FIG. 1). The second part 152 includes light-transmissive material that is similar to the first part 151. The light-transmissive material included in the second part 152 may be the same as or may be different from the light-transmissive material included in the first part 151.

As illustrated in FIG. 5, the second lens 171 shapes the light L incident from the first lens 163. The second lens 171 may shape the incident light into collimated light. However, the second lens 171 may shape the incident light into another type of light that is suitable for transmission.

The second lens 171 may be a convex lens that has a convex shape and that is provided on a side of the second part opposite to the first part 151. The second lens 171 is provided for each of the optical fibers 120. The second lenses 171 are arrayed in such a manner that optical axes of light output from the respective first lenses 163 are identical to centers of the respective second lenses 163.

The light transmission space 172 is a space formed of a concave part provided on the second part 152 around the second lenses 171. The light L output from the second lenses 171 passes through the light transmission space 172.

The connection parts 173 connect to an optical communication connector (hereinafter, referred to as a mating connector) that is a connection target for the optical communication connector 100, and fix relative positions of the optical communication connector 100 and the mating connector. The connection parts 173 may be concave parts that fit into convex parts provided on the mating connector, or may be convex parts that fit into concave parts provided on the mating connector.

Note that, the connection parts 173 may be any connection parts as long as it is possible to fix their positions relative to the mating connector. Alternatively, the second part 152 does not have to include the connection parts 173. A connection mechanism capable of fixing its position relative to the mating connector may be provided around the optical communication connector 100.

The second part 152 may be joined to the first part 151 when the concave parts or convex parts of the second part 152 fit into the convex parts or concave parts of the first part 151. In addition, the first part 151 may be joined to the second part 152 through adhesion after the optical axes are adjusted by using an image processing system or the like in such a manner that the optical axes of the first lenses 163 become identical to optical axes of the second lenses 171.

As described above, the connector main body 150 defines the relative positions of the optical fibers 120, the first lenses 163, and the second lenses 171.

The optical communication connector 100 is configured as described above. Note that, the case where the optical fibers 120 emit the light L, that is, the case where the optical fibers 120 serve as light emitters has been described above. Here, sometimes the light L may enter the optical communication connector 100 from the mating connector and may be collected at the optical fibers 120. In other words, sometimes the optical fibers 120 of the optical communication connector 100 serve as light receivers.

In this case, light L shaped into collimated light or the like enters the second lenses 171 from the mating connector (see FIG. 5). The second lenses 171 collect the incident light L at the first lenses 163. The first lenses 163 collect the light incident from the second lenses 171 at the cores 121 of the optical fibers 120.

[Behavior of Optical Communication Connector]

Behavior of the optical communication connector 100 will be described. In the case where the optical fiber 120 serves as the light emitter, the first lens 163 magnifies the light L emitted from the core 121 of the optical fiber 120, and the second lens 171 shapes the magnified light L as described above.

By providing the first lens 163 between the optical fiber 120 and the second lens 171, it is possible to enlarge the diameter (D in FIG. 5) of light output from the second lens 171 even when the distance (R in FIG. 5) between the optical fiber 120 and the second lens 171 is short.

In addition, in the case where the optical fiber 120 serves as the light receiver, light incident on the second lens 171 is collected at the first lens 163, and the first lens 163 collects the light at the core 121.

In this case, the installation of the first lens 163 also makes it possible to enlarge the diameter D of light L incident on the second lens 171 while the short distance R between the optical fiber 120 and the second lens 171 is maintained.

[Optical Communication Connector Set]

Figure 6:
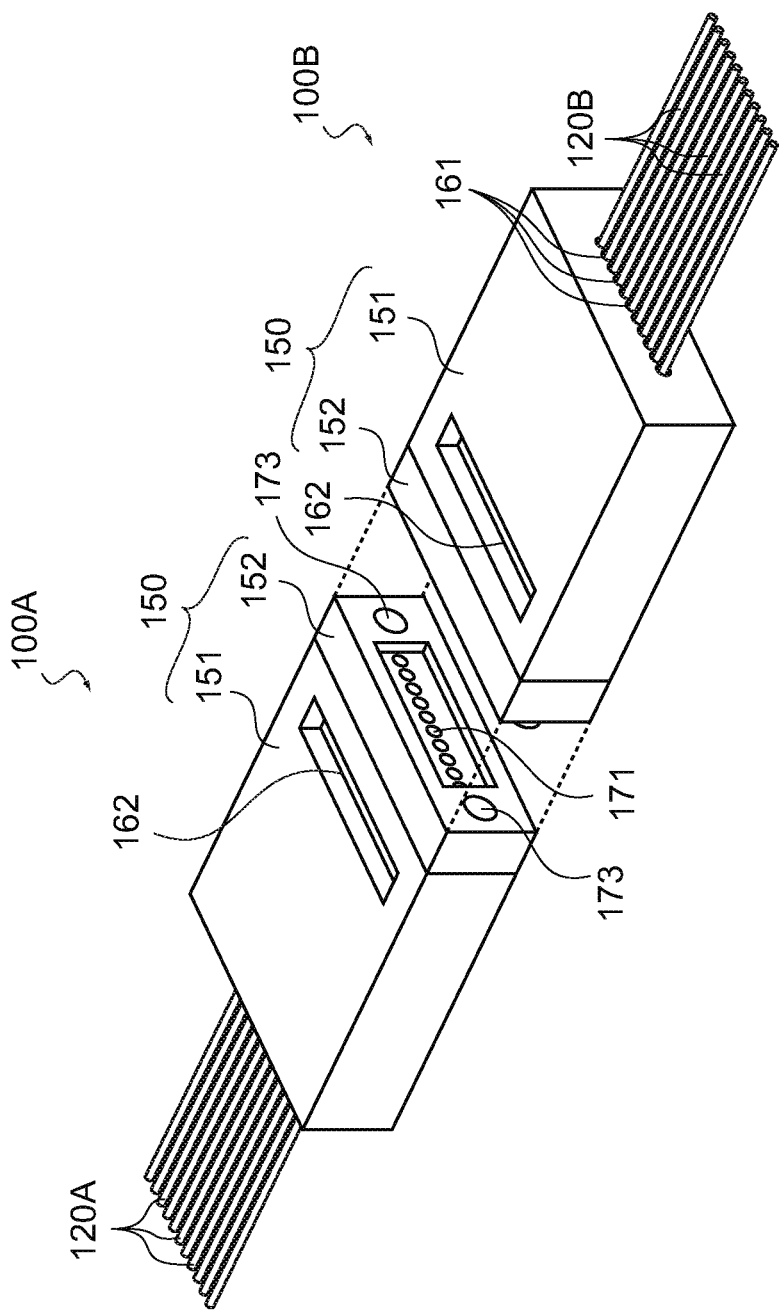
FIG. 6 is a perspective view of a connector set including the optical communication connectors.

The optical communication connector 100 is capable of connecting to a mating optical communication connector 100. FIG. 6 is a perspective view of a connector set including the two optical communication connectors 100, and FIG. 7 is a cross-sectional view of the connector set in which the two optical communication connectors 100 are connected to each other.

Hereinafter, one of the optical communication connectors 100 will be referred to as an optical communication connector 100A, and the other of the optical communication connectors 100 will be referred to as an optical communication connector 100B. In addition, optical fibers 120 connected to the optical communication connector 100A will be referred to as optical fibers 120A, and optical fibers 120 connected to the optical communication connector 100B will be referred to as optical fibers 120B.

As described above, the optical communication connector 100A and the optical communication connector 100B are connected to each other through their connection parts 173 or the like.

Figure 7:
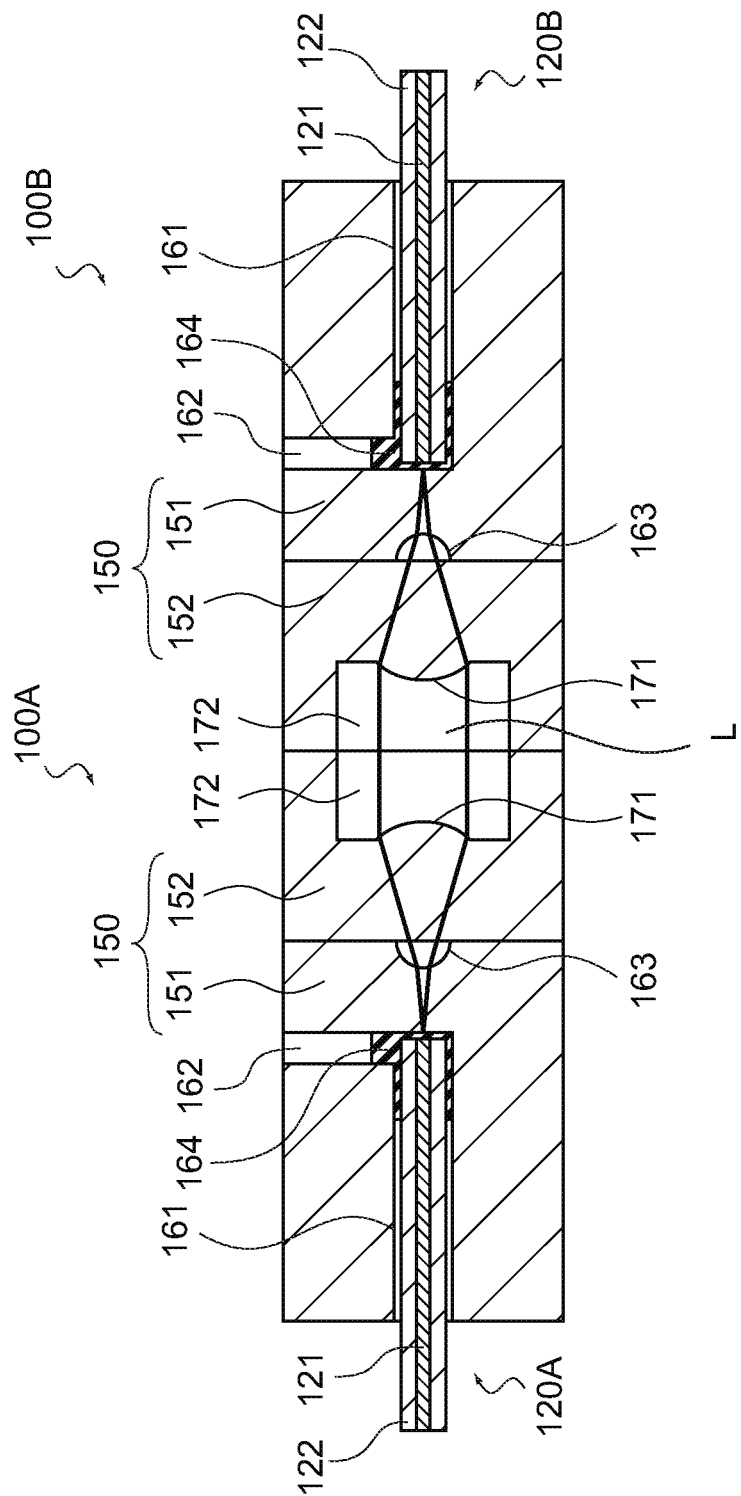
FIG. 7 is a cross-sectional view of the connector set including the optical communication connectors.

When the light L is transmitted from the optical fibers 120A to the optical communication connector 100A, the light L enters the first lenses 163 from the cores 121 of the optical fibers 120A as illustrated in FIG. 7. The first lenses 163 magnify the light L, and the second lenses 171 shape the magnified light.

The light L output from the second lenses 171 propagates through the light transmission space 172, and enters the optical communication connector 100B. In the optical communication connector 100B, the second lenses 171 collect the light L at the first lenses 163, and the first lenses 163 collect the light L at the cores 121 of the optical fibers 120B.

In addition, when the light L is supplied from the optical fibers 120B to the optical communication connector 100B, the light L enters the first lenses 163 from the cores 121 of the optical fibers 120B as illustrated in FIG. 7. The first lenses 163 magnify the light L, and the second lenses 171 shape the magnified light.

The light L output from the second lenses 171 propagates through the light transmission space 172, and enters the optical communication connector 100A. In the optical communication connector 100A, the second lenses 171 collect the light L at the first lenses 163, and the first lenses 163 collect the light L at the cores 121 of the optical fibers 120A.

As described above, the light L is transmitted between the optical communication connector 100A and the optical communication connector 100B through the optical transmission spaces 172. In other words, spatial optical coupling is achieved.

[Effects of Optical Communication Connector]

Effects of the optical communication connector will be described in comparison with comparative examples.

Figure 8A:
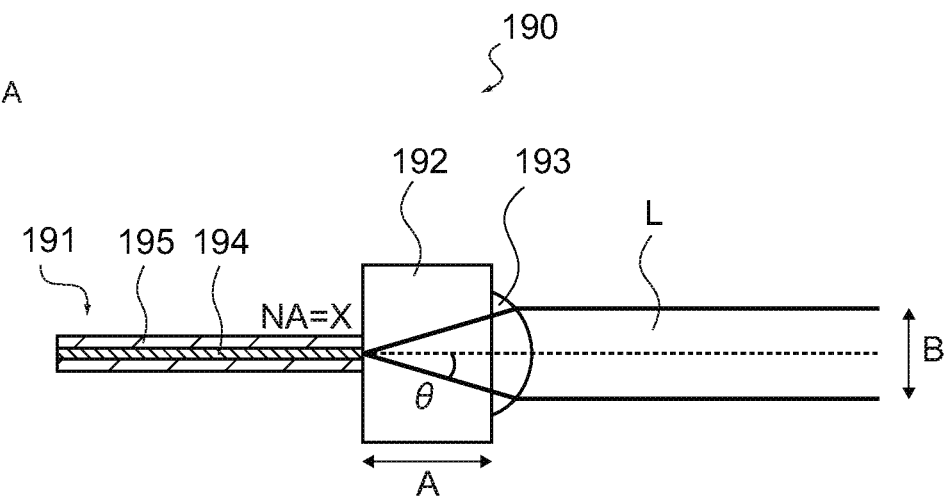
FIGS. 8A and 8B are schematic diagrams illustrating optical communication connectors according to comparative examples.
Figure 8B:
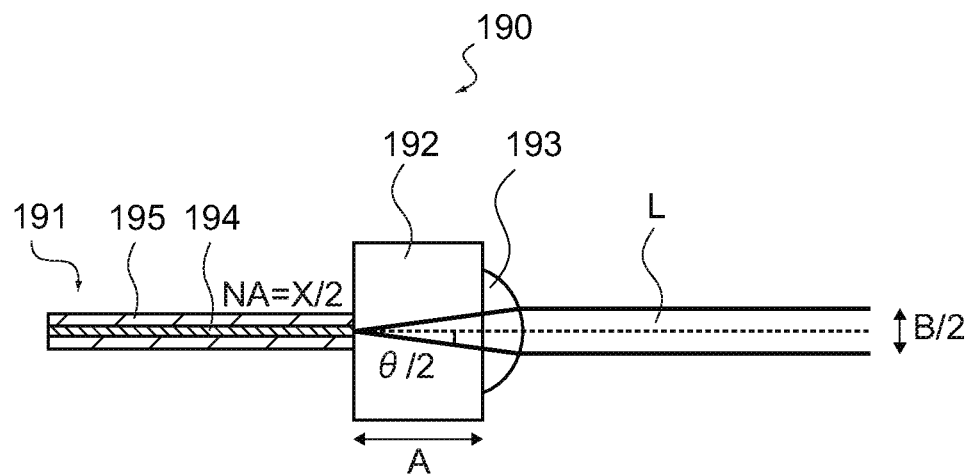

FIGS. 8A and 8B are schematic diagrams illustrating optical communication connectors 190 having general configurations according to comparative examples. As illustrated in FIG. 8A, the optical communication connector 190 includes optical fibers 191, a light-transmissive member 192, and lenses 193. The optical fiber 191 includes a core 194 and cladding 195. A distance A represents the length of the light-transmissive member 192, that is, the distance between the core 194 and the lens 193.

Light L emitted from the core 194 passes through the light-transmissive member 192, and the lens 193 shapes the light L into collimated light. A dotted line represents an optical axis of the light L, and a diameter B represents the diameter of the collimated light. An emission angle θ of the light L emitted from the core 194 is decided on the basis of a numerical aperture NA based on a difference in refractive indices between the core 194 and the light-transmissive member 192. The numerical aperture NA=X is satisfied with regard to the configuration illustrated in FIG. 8A.

FIG. 8B illustrates a path of light L obtained in the case where the numerical aperture NA is reduced by half (X/2) in comparison with the configuration illustrated in FIG. 8A. In this case, an emission angle of the light L becomes θ/2, and the diameter of collimated light becomes B/2 as illustrated in FIG. 8B.

Figure 9A:
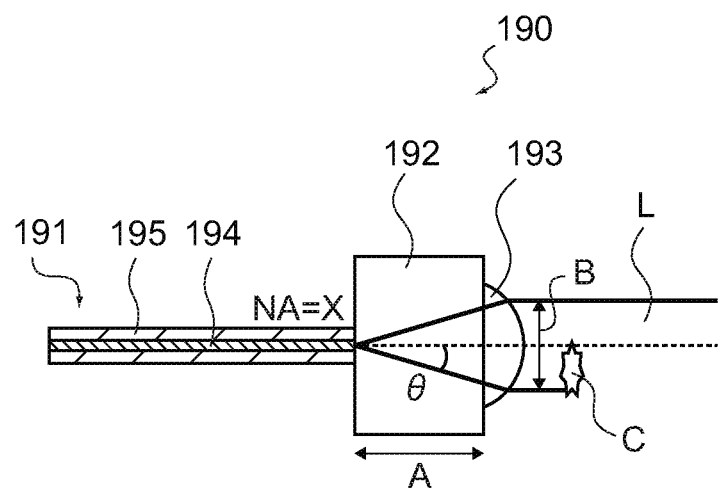
FIGS. 9A and 9B are schematic diagrams illustrating the optical communication connectors according to the comparative examples.
Figure 9B:
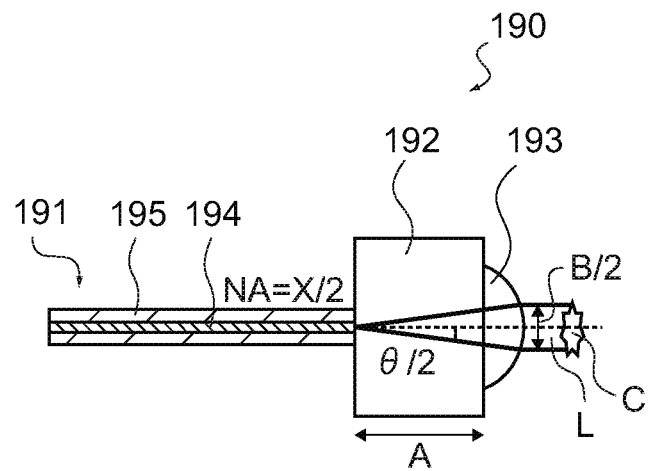

FIGS. 9A and 9B are schematic diagrams illustrating effects of a foreign substance on the light. In the case where the numerical aperture NA is X/2 and the diameter of the collimated light is B/2 as illustrated in FIG. 9B, there is a possibility that inclusion of a foreign substance C such as grit blocks all the collimated light and an optical signal is blocked.

On the other hand, in the case where the numerical aperture NA is X and the diameter of the collimated light is B as illustrated in FIG. 9A, the foreign substance C blocks only a portion of the collimated light and the optical signal is transmitted. As described above, it becomes easier to ensure communication power as the collimated light emitted from the optical communication connector 190 has a larger diameter.

Figure 10:
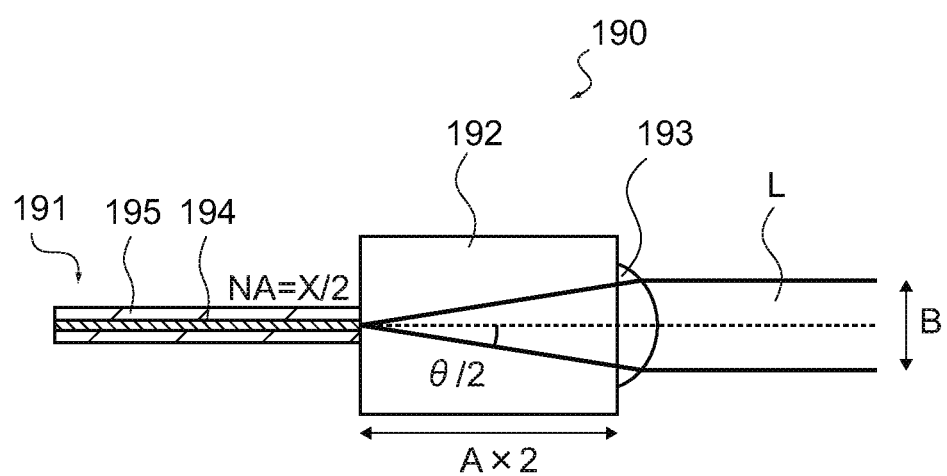
FIG. 10 is a schematic diagram illustrating an optical communication connector according to a comparative example.

To enlarge the diameter of the collimated light in the case where the numerical aperture is small, it is sufficient to lengthen the distance between the core 194 and the lens 193. FIG. 10 is a schematic diagram illustrating an optical communication connector 190 in which the numerical aperture is X/2 but the distance between the core 194 and the lens 193 is A×2. As illustrated in FIG. 10, it is possible to enlarge the diameter of the collimated light by lengthening the distance between the core 194 and the lens 193 even in the case where the numerical aperture is small.

Figure 11A:
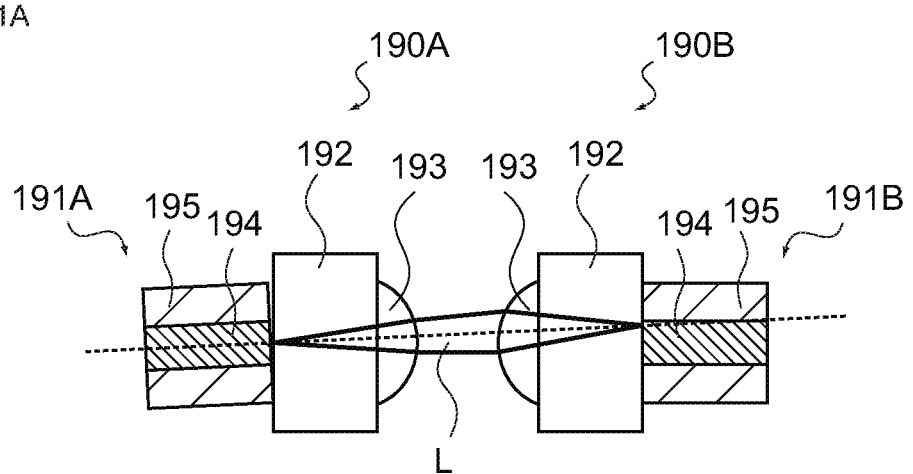
FIGS. 11A and 11B are schematic diagrams illustrating the optical communication connectors according to the comparative examples.
Figure 11B:
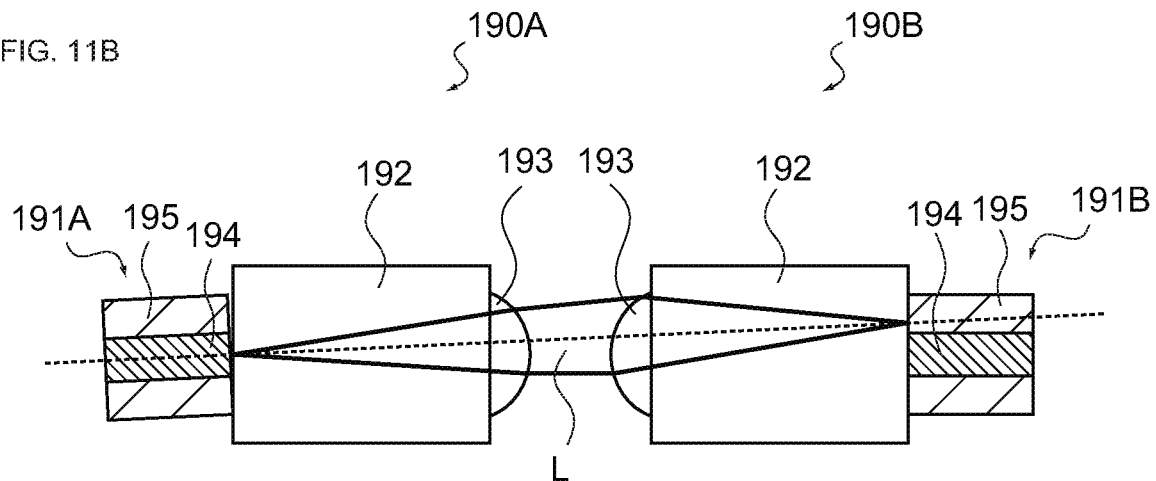

However, another problem arises when the distance between the core 194 and the lens 193 is lengthened. FIGS. 11A and 11B are schematic diagrams illustrating an effect of such a distance. FIGS. 11A and 11B illustrate scenarios where light is transmitted between the two optical communication connectors 190. Hereinafter, one of the optical communication connectors 190 will be referred to as an optical communication connector 190A, and the other of the optical communication connectors 190 will be referred to as an optical communication connector 190B. In addition, optical fibers included in the optical communication connector 190A will be referred to as optical fibers 191A, and optical fibers included in the optical communication connector 190B will be referred to as optical fibers 191B.

As illustrated in FIG. 11A, sometimes the optical fiber 191A tilts when light is transmitted between the two optical communication connectors 190. The optical fiber tilts because of lack of accuracy of parts, lack of accuracy of mounting, or thermal deformation of the parts, for example.

In the case where the distance between the optical fibers is short as illustrated in FIG. 11A, the light L emitted from the optical communication connector 190A enters the core 194 of the optical fiber 191B and it is possible to establish optical communication even when the optical fiber 191A tilts.

On the other hand, in the case where the distance between the optical fibers is long as illustrated in FIG. 11B, effects of the tilt of the optical fiber 191A increases. Therefore, when the optical fiber 191A tilts, the light L emitted from the optical communication connector 190A does not enter the core 194 of the optical fiber 191B, and the optical communication is blocked.

As described above, in the case where the optical communication connector 190 has a small numerical aperture, it is impossible to gain both tolerance to foreign substance inclusion and tolerance to tilt of the optical fiber, and it is difficult to ensure communication quality. In particular, the single-mode fiber has a smaller numerical aperture than the multi-mode fiber. Therefore, the single-mode fiber is likely to have the above-described problems.

However, the optical communication connector 100 according to the present embodiment magnifies light emitted from the optical fibers 120 through the first lenses 163 (see FIG. 5) and then the magnified light enters the second lenses 171 that shape the light as described above.

This makes it possible to enlarge the diameter D of the light output from the second lens 171 even when the distance R between the optical fiber 120 and the second lens 171 is short.

This makes it possible to gain both the tolerance to foreign substance inclusion and the tolerance to tilt of the optical fiber 120 even when the numerical aperture is small, and this makes it possible to ensure communication quality.

In addition, the optical communication connector 100 may be obtained by inserting the optical fibers 120 into the optical fiber insertion holes 161 and injecting the adhesive 164 into the adhesive injection hole 162.

Therefore, it is not necessary to individually process the optical fibers such as joining materials having different refractive indices, and this makes it possible to reduce cost. In particular, such an effect is increased in the case of a multichannel configuration including many optical fibers.

[Configuration of Optical Communication Cable]

Figure 12:
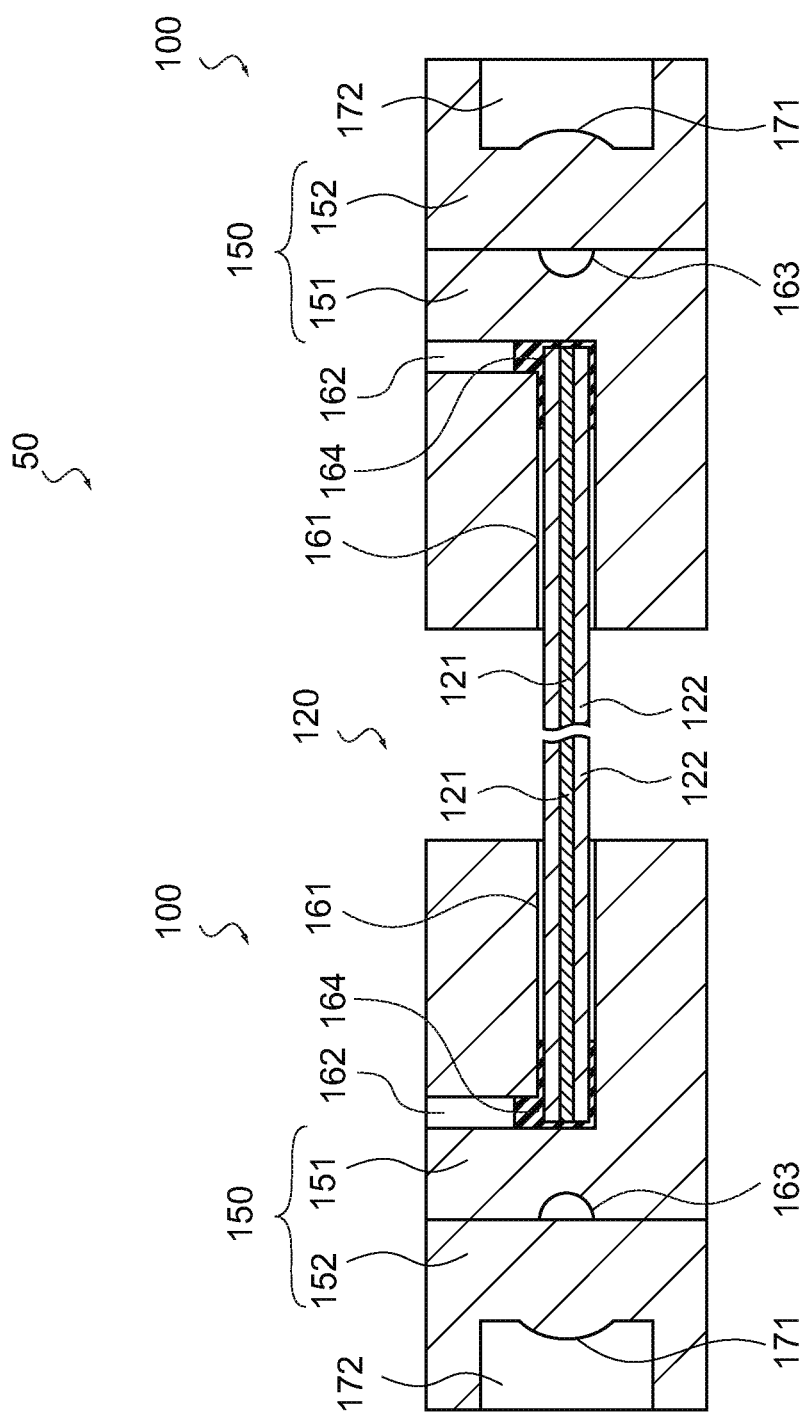
FIG. 12 is a cross-sectional view of an optical communication cable including the optical communication connectors according to the first embodiment of the present technology.

An optical communication cable including the optical communication connectors 100 will be described. FIG. 12 is a schematic diagram illustrating an optical communication cable 50 according to the present embodiment. As illustrated in FIG. 12, the optical communication cable 50 can be obtained by connecting the two optical communication connectors 100 to respective ends of the single optical fiber 120.

[Configuration of Optical Communication System]

Figure 13:
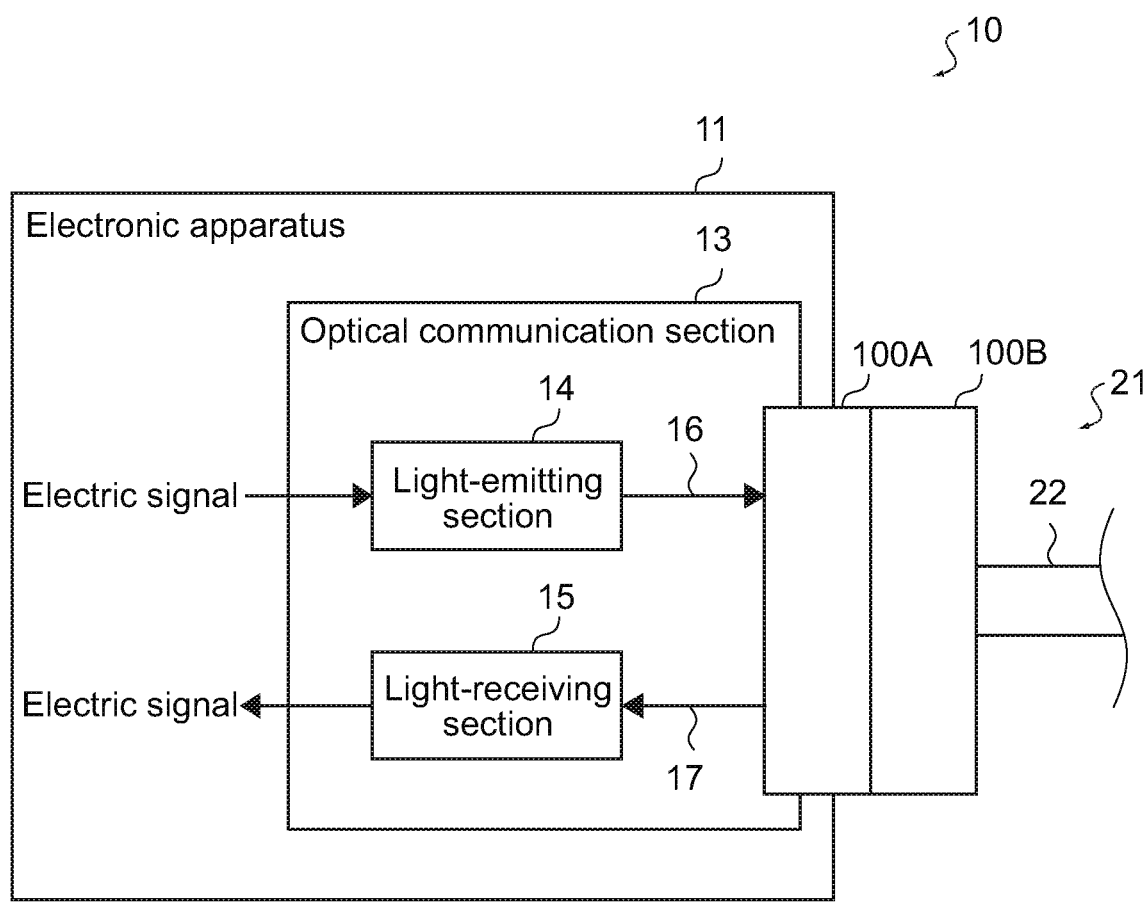
FIG. 13 is a schematic diagram illustrating an optical communication system including the optical communication connectors.

An optical communication system using the optical communication connectors 100 will be described. FIG. 13 is a block diagram illustrating an optical communication system 10 according to the present embodiment. As illustrated in FIG. 13, the optical communication system 10 includes an electronic apparatus 11 and an optical communication cable 21.

As illustrated in FIG. 13, the electronic apparatus 11 includes an optical communication section 13. The optical communication section 13 includes a light-emitting section 14, a light-receiving section 15, an optical transmission line 16, an optical transmission line 17, and the optical communication connector 100A (see FIG. 7).

The light-emitting section 14 includes a laser element such as a vertical-cavity surface-emitting laser (VCSEL) or a light-emitting element such as a light-emitting diode (LED), and is connected to the optical transmission line 16. The light-emitting section 14 converts an electric signal output from the electronic apparatus 11 into an optical signal, and outputs the optical signal to the optical communication connector 100A via the optical transmission line 16. The optical transmission line 16 may be implemented by the optical fiber 120A (see FIG. 7).

The light-receiving section 15 includes a light receiving element such as a photodiode, and is connected to the optical transmission line 17. The light-receiving section 15 converts an optical signal transmitted from the optical communication connector 100A via the optical transmission line 17 into an electric signal, and outputs the electric signal to the electronic apparatus 11. The optical transmission line 17 may be implemented by the optical fiber 120A (see FIG. 7).

The optical communication cable 21 includes a cable main body 22 and the optical communication connector 100B (see FIG. 7). The cable main body 22 may be implemented by the optical fibers 120B (see FIG. 7). The optical communication cable 21 may have the same configuration as the optical communication cable 50, and the other end of the cable main body 22 may be connected to another electronic apparatus.

The cable main body 22 may connect the optical communication connector 100B to another optical communication connector, and transmit optical signals between the optical communication connectors.

The optical transmission line 16 connected to the light-emitting section 14 functions as a light emitter, and the optical transmission line 17 connected to the light-receiving section 15 functions as a light receiver. The light-emitting section 14, the optical transmission line 16, and the optical communication connector 100A constitute the optical transmitter, and the light-receiving section 15, the optical transmission line 17, and the optical communication connector 100A constitute the optical receiver. The electronic apparatus 11 may include only one of the optical transmitter or the optical receiver.

The electronic apparatus 11 may be a mobile electronic apparatus such as a mobile phone, a smartphone, a PHS phone, a PDA, a tablet PC, a laptop computer, a video camera, an IC recorder, a mobile media player, an electronic organizer, an electronic dictionary, an electronic calculator, a mobile video game console, or may be an electronic apparatus such as a desktop computer, a display apparatus, a television receiver, a radio receiver, a video recorder, a printer, a car navigation system, a game console, a router, a hub, or an optical network unit (ONU), for example. Alternatively, the electronic apparatus 11 may constitute all or a portion of a vehicle or an electrical machine such as a refrigerator, a washing machine, a clock, a doorphone, an air conditioner, a humidifier, an air purifier, lighting equipment, or a cooking appliance.

Figure 14:
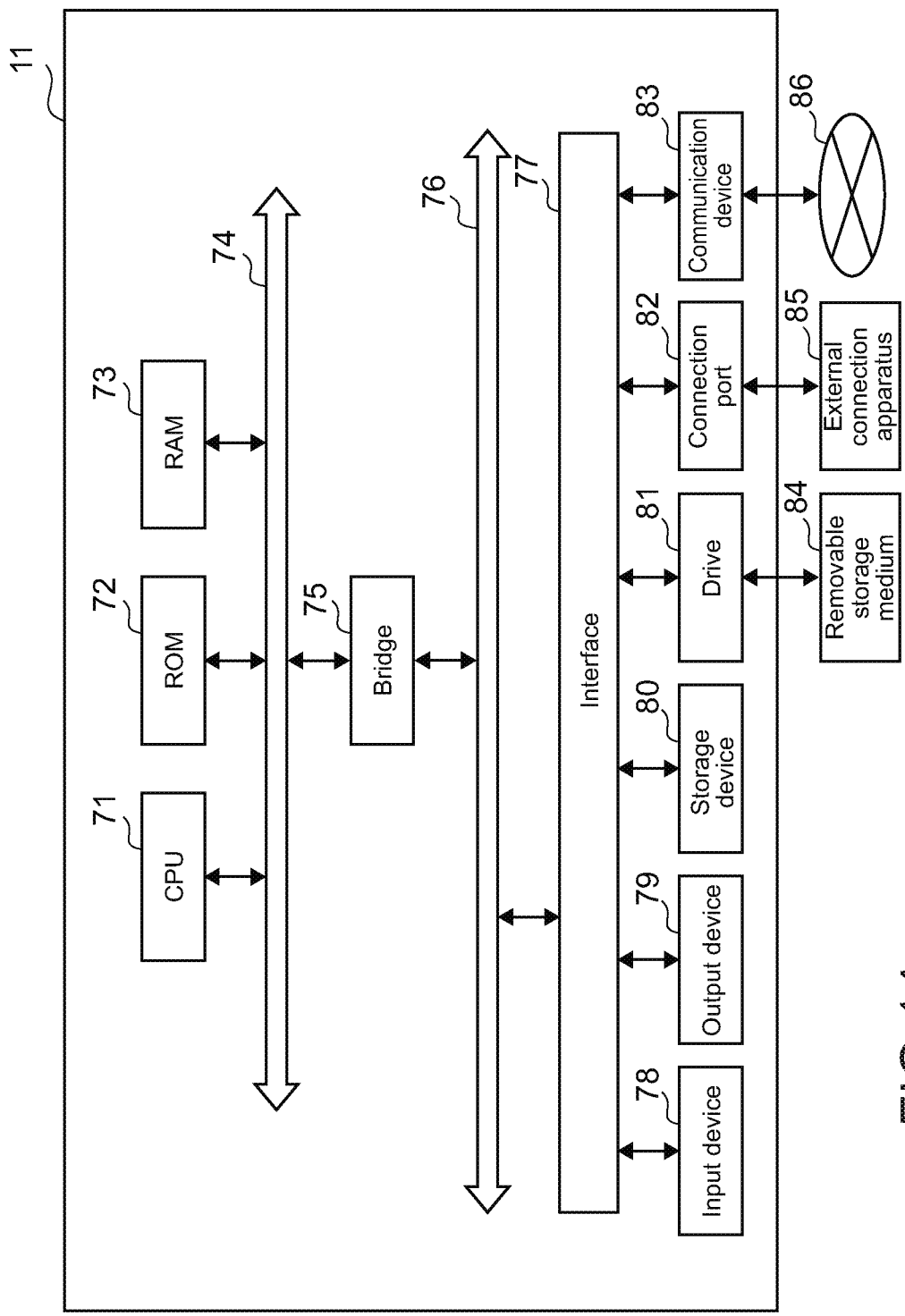
FIG. 14 is a schematic diagram illustrating a configuration of an electronic apparatus of the optical communication system including the optical communication connectors.

A detailed hardware configuration of the electronic apparatus 11 is not specifically limited. For example, FIG. 14 illustrates an example of the detailed hardware configuration of the electronic apparatus 11. FIG. 14 is a block diagram for describing the hardware configuration of the electronic apparatus 11.

The electronic apparatus 11 mainly includes a CPU 71, ROM 72, and RAM 73. In addition, the electronic apparatus 11 further includes a host bus 74, a bridge 75, an external bus 76, an interface 77, an input device 78, an output device 79, a storage device 80, a drive 81, a connection port 82, and a communication device 83.

The CPU 71 functions as an arithmetic processing device and a control device, and controls the overall operation or a part of the operation of the electronic apparatus 11 in accordance with various programs recorded on the ROM 72, the RAM 73, the storage device 80, or a removable recording medium 84. The ROM 72 transiently stores programs that the CPU 71 uses, parameters varying as appropriate during the execution of the programs, and the like. They are connected to each other via the host bus 74 constituted by an internal bus such as a CPU bus.

The host bus 74 is connected to the external bus 76 such as a Peripheral Component Interconnect/Interface (PCI) bus via the bridge 75.

The input device 78 is an operational tool operated by a user such as a mouse, a keyboard, a touchscreen, a button, a switch, or a lever, for example. In addition, for example, the input device 78 may be a remote control tool (so-called remote controller) using infrared ray or other electric waves, or may be an external connection apparatus 85 such as a mobile phone or a PDA that are compatible with operation of the electronic apparatus 11. Furthermore, the input device 78 may include an input control circuit or the like that is configured to generate an input signal on the basis of information input by the user using the aforementioned operational tool and to output the generated input signal to the CPU 71. The user of the electronic apparatus 11 is capable of inputting various types of data to the electronic apparatus 11, and instructing the electronic apparatus 11 to perform processing operation, by operating the input device 78.

The output device 79 includes a device that can visually or audibly report acquired information to the user. Examples of such a device include display devices such as a CRT display device, a liquid crystal display device, a plasma display device, an EL display device, and lamps, audio output devices such as a speaker and a headphone, a printer, a mobile phone, a fax machine, and the like. The output device 79 outputs, for example, results acquired through various processes performed by the electronic apparatus 11. Specifically, the display device displays results acquired through various processes performed by the electronic apparatus 11 in a text format, or in an image format. On the other hand, the audio output device converts an audio signal including reproduced audio data, acoustic data, or the like into an analog signal, and outputs the analog signal.

The storage device 80 is a device for data storage. The storage device 80 is an example of a storage of the electronic apparatus 11. The storage device 80 includes, for example, a magnetic storage device such as a hard disk drive (HDD), a semiconductor storage device, an optical storage device, a magneto-optical storage device, or the like. The storage device 80 stores therein programs and various kinds of data executed by the CPU 71, various kinds of data acquired from an outside, and the like.

The drive 81 is a reader/writer for a recording medium, and is incorporated in or externally attached to the electronic apparatus 11. The drive 81 reads information recorded on the removable recording medium 84 that is mounted such as a magnetic disk, an optical disc, a magneto-optical disk, or semiconductor memory, and outputs the information to the RAM 73. In addition, the drive 81 is also capable of writing records into the removable recording medium 84 that is mounted such as a magnetic disk, an optical disc, a magneto-optical disk, or semiconductor memory. Examples of the removable recording medium 84 include a DVD medium, an HD-DVD medium, a Blu-ray medium, and the like. Alternatively, the removable recording medium 84 may be CompactFlash (CF) (registered trademark), flash memory, a secure digital (SD) memory card, or the like. Alternatively, the removable recording medium 84 may be, for example, an electronic apparatus, an integrated circuit (IC) card on which a non-contact IC chip is mounted, or the like.

The connection port 82 is a port used for directly connecting an apparatus to the electronic apparatus 11. Examples of the connection port 82 include a Universal Serial Bus (USB) port, an IEEE 1394 port, a Small Computer System Interface (SCSI) port, and the like. Other examples of the connection port 82 include an RS-232C port, an optical digital terminal, a High-Definition Multimedia Interface (HDMI) port, and the like. By connecting the external connection apparatus 85 to the connection port 82, the electronic apparatus 11 is capable of directly acquiring various kinds of data from the external connection apparatus 85 and providing various kinds of data to the external connection apparatus 85. Note that, the optical digital terminal may be implemented as the optical communication section 13 including the optical communication connector 100 described above.

The communication device 83 is a communication interface including, for example, a communication device or the like for connection to a communication network 86. According to the present embodiment, the communication device 83 includes the optical communication section 13 including the optical communication connector 100 described above. The communication device 83 may be a router for optical communication. In addition, the communication device 83 may further include, for example, a communication card or the like for a wired or wireless local area network (LAN), Bluetooth (registered trademark), or a wireless USB (WUSB). In addition, the communication device 83 may also include a router for asymmetric digital subscriber line (ADSL), a modem for various types of communication, or the like. For example, the communication device 83 is capable of transmitting and receiving signals and the like to and from the Internet or other communication apparatuses, for example, in accordance with a predetermined protocol of TCP/IP, FTTx such as FTTR, FTTB, FTTH, or FTTD, or the like. In addition, the communication network 86 to which the communication device 83 connects is constituted by a network established through wired or wireless connection. The communication network 86 may be, for example, the Internet, a home LAN, infrared communication, radio communication, satellite communication, or the like.

Second Embodiment

An optical communication connector according to a second embodiment of the present technology will be described.

[Configuration of Optical Communication Connector]

Figure 15:
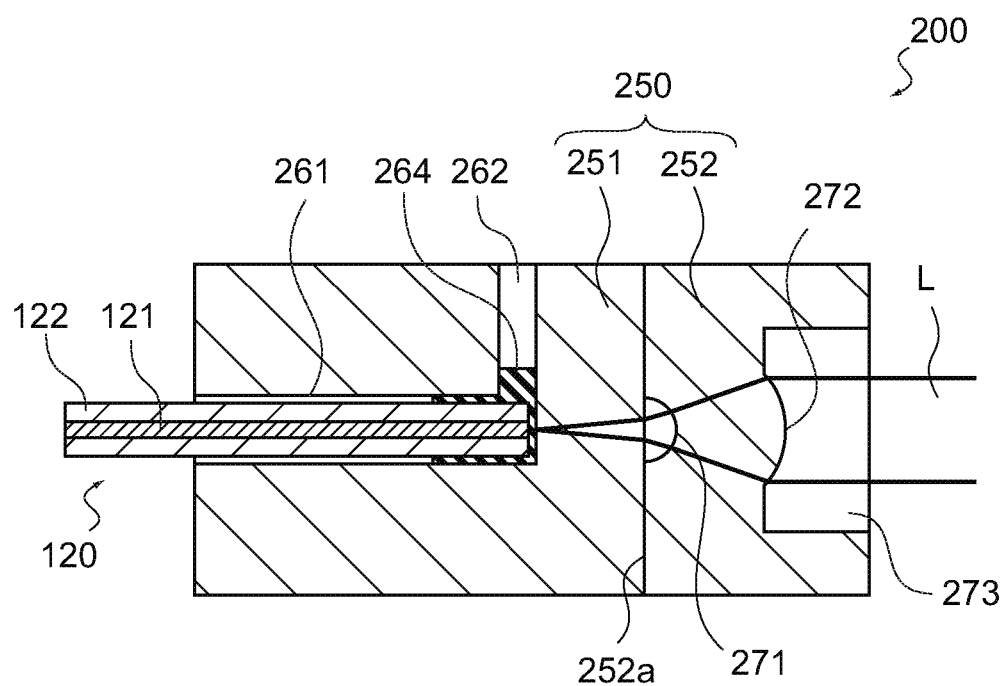
FIG. 15 is a cross-sectional view of an optical communication connector according to a second embodiment of the present technology.

FIG. 15 is a cross-sectional view of an optical communication connector 200 according to the second embodiment of the present technology. As illustrated in FIG. 15, the optical fibers 120 are connected to the optical communication connector 200. The number of optical fibers 120 may be one or more.

As illustrated in FIG. 15, the optical communication connector 200 includes a connector main body 250, and the connector main body 250 includes a first part 251 and a second part 252.

The first part 251 includes light-transmissive material that is similar to the first embodiment, and the first part 251 has optical fiber insertion holes 261 and an adhesive injection hole 262.

The optical fiber insertion hole 261 is a hole into which the optical fiber 120 is inserted. The optical fiber insertion hole 161 extends from an end of the first part 251 opposite to the second part 252 to have a certain length.

The optical fiber insertion hole 261 is made for each of the optical fibers 120. The optical fibers 120 are inserted into the respective optical fiber insertion holes 261, and are fixed to the first part 251 with an adhesive 264. A light-transmissive adhesive is suitable for the adhesive 264, and the adhesive 264 may be refractive index matching material.

The adhesive injection hole 262 is a hole that communicates with the respective optical fiber insertion holes 261. The adhesive 264 is injected into the adhesive injection hole 262 and surrounds portions of the optical fibers 120.

The second part 252 is joined to the first part 251, and the second part 152 includes first lenses 271, second lenses 271, and a light transmission space 273. The second part 252 includes light-transmissive material that is similar to the first embodiment.

The first lens 271 magnifies light emitted from the core 121 of the optical fiber 120. As illustrated in FIG. 15, the light L emitted from the optical fiber 120 passes through the adhesive 264 and the first part 251 and enters the first lens 271, and then the first lens 271 magnifies the light L.

The first lens 271 may be a concave lens that has a concave shape and that is provided on a junction surface 252a. The junction surface 252a is a junction surface of the second part 252 with the first part 251. The concave part constituting the first lens 271 is sealed with the first part 251.

The first lens 271 is provided for each of the optical fibers 120. The first lenses 271 are arrayed in such a manner that optical axes of light emitted from the respective optical fibers 120 are identical to centers of the respective first lenses 271.

As illustrated in FIG. 15, the second lens 272 shapes the light L incident from the first lens 271. The second lens 272 may shape the incident light into collimated light. Alternatively, the second lens 272 may shape the incident light into another type of light that is suitable for transmission.

The second lens 272 may be a convex lens that has a convex shape and that is provided on a side of the second part opposite to the first part 251. The second lens 272 is provided for each of the optical fibers 120. The second lenses 272 are arrayed in such a manner that optical axes of light output from the respective first lenses 271 are identical to centers of the respective second lenses 271.

The light transmission space 273 is a space formed of a concave part provided on the second part 252 around the second lenses 272. The light L output from the second lenses 272 passes through the light transmission space 273.

The second part 252 may be joined to the first part 251 when the concave parts or convex parts of the second part 252 fit into the convex parts or concave parts of the first part 251 or when the second part 252 adheres to the first part 251, for example.

As described above, the connector main body 250 defines the relative positions of the optical fibers 120, the first lenses 271, and the second lenses 272.

In a way similar to the optical communication connector 100, the optical communication connector 200 magnifies light emitted from the optical fibers 120 through the first lenses 271 and then the magnified light enters the second lenses 272 that shape the light. This makes it possible to enlarge the diameter of the light output from the second lenses 272 even when the distances between the optical fibers 120 and the second lenses 272 are short.

This allows an optical communication connector set in which the two optical communication connectors 200 are connected to each other to gain both the tolerance to foreign substance inclusion and the tolerance to tilt of the optical fibers 120, and this makes it possible to ensure communication quality.

Note that, in the case where shaped light L enters the optical communication connector 200, the second lenses 272 collect the light L at the first lenses 271, and the first lenses 271 collect the light L at the cores 121.

[Optical Communication Cable and Optical Communication System]

In a way similar to the first embodiment, it is possible to configure the optical communication cable and the optical communication system by using the optical communication connectors 200.

Third Embodiment

An optical communication connector according to a third embodiment of the present technology will be described.

[Another Configuration of Optical Communication Connector]

Figure 16A:
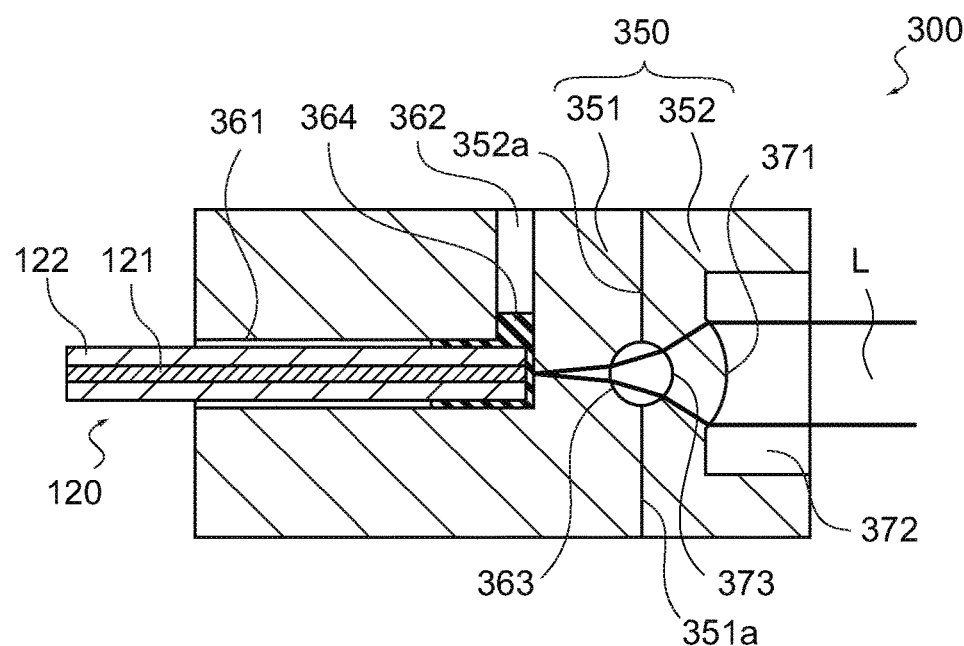
FIGS. 16A and 16B are cross-sectional views of an optical communication connector according to a third embodiment of the present technology.
Figure 16B:
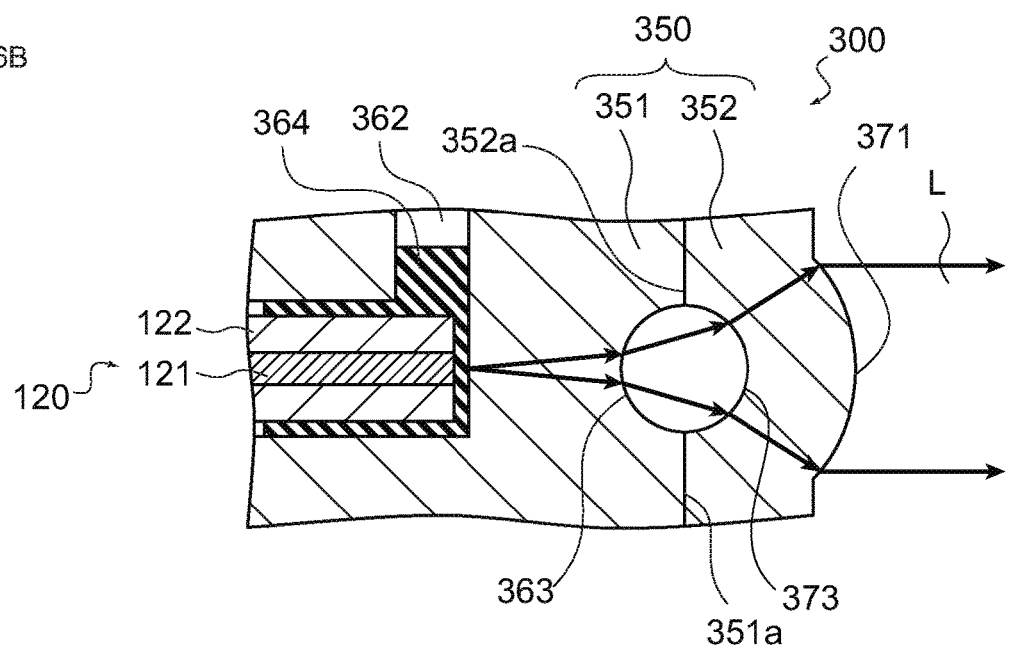

FIGS. 16A and 16B are cross-sectional views of an optical communication connector 300 according to the third embodiment of the present technology. FIG. 16A is an overall view, and FIG. 16B is an enlarged view. As illustrated in FIGS. 16A and 16B, the optical fibers 120 are connected to the optical communication connector 300. The number of optical fibers 120 may be one or more.

As illustrated in FIGS. 16A and 16B, the optical communication connector 300 includes a connector main body 350, and the connector main body 350 includes a first part 351 and a second part 352.

The first part 351 includes light-transmissive material that is similar to the first embodiment, and the first part 351 has optical fiber insertion holes 361, an adhesive injection hole 362, and first lenses 363.

The optical fiber insertion hole 361 is a hole into which the optical fiber 120 is inserted. The optical fiber insertion hole 161 extends from an end of the first part 351 opposite to the second part 352 to have a certain length.

The optical fiber insertion hole 361 is made for each of the optical fibers 120. The optical fibers 120 are inserted into the respective optical fiber insertion holes 361, and are fixed to the first part 351 with an adhesive 364. A light-transmissive adhesive is suitable for the adhesive 364, and the adhesive 364 may be refractive index matching material.

The adhesive injection hole 362 is a hole that communicates with the respective optical fiber insertion holes 361. The adhesive 364 is injected into the adhesive injection hole 362 and surrounds portions of the optical fibers 120.

The first lens 363 magnifies light L emitted from the core 121 of the optical fiber 120. As illustrated in FIG. 16B, the light L emitted from the optical fiber 120 passes through the adhesive 364 and the first part 351 and enters the first lens 363, and then the first lens 363 magnifies the light L.

As illustrated in FIG. 16B, the first lens 363 may be a concave lens that has a concave shape and that is provided on a junction surface 351a. The junction surface 351a is a junction surface of the first part 351 with the second part 352.

The first lens 363 is provided for each of the optical fibers 120. The first lenses 363 are arrayed in such a manner that optical axes of light emitted from the respective optical fibers 120 are identical to centers of the respective first lenses 163.

The second part 352 is joined to the first part 351, and the second part 352 includes second lenses 371, a light transmission space 372, and third lenses 373. The second part 352 includes light-transmissive material that is similar to the first embodiment.

As illustrated in FIG. 16B, the third lens 373 magnifies the light output from the first lens 363. The third lens 373 may be a concave lens that has a concave shape and that is provided on a junction surface 352a. The junction surface 352a is a junction surface of the second part 352 with the first part 351.

The concave part constituting the third lens 373 and the concave part constituting the first lens 363 form a space that communicates with the both concave parts. This space is sealed with the first part 351 and the second part 352.

The third lens 373 is provided for each of the optical fibers 120. The third lenses 372 are arrayed in such a manner that optical axes of light output from the respective first lenses 363 are identical to centers of the respective third lenses 373.

The second lens 371 shapes the light L incident from the third lens 373. The second lens 371 may shape the incident light into collimated light. Alternatively, the second lens 171 may shape the incident light into another type of light that is suitable for transmission.

The second lens 371 may be a convex lens that has a convex shape and that is provided on a side of the second part 352 opposite to the first part 351. The second lens 371 is provided for each of the optical fibers 120. The second lenses 371 are arrayed in such a manner that optical axes of light output from the respective third lenses 373 are identical to centers of the respective second lenses 371.

The light transmission space 372 is a space formed of a concave part provided on the second part 352 around the second lenses 371. The light L output from the second lenses 371 passes through the light transmission space 372.

The second part 352 may be joined to the first part 351 when the concave parts or convex parts of the second part 352 fit into the convex parts or concave parts of the first part 351 or when the second part 352 adheres to the first part 351, for example.

As described above, the connector main body 350 defines the relative positions of the optical fibers 120, the first lenses 363, the second lenses 371, and the third lenses 373.

The optical communication connector 300 magnifies light emitted from the optical fibers 120 through the first lenses 363 and the third lenses 373 and then the magnified light enters the second lenses 371 that shape the light. This makes it possible to enlarge the diameter of the light output from the second lenses 371 even when the distances between the optical fibers 120 and the second lenses 371 are short.

This allows an optical communication connector set in which the two optical communication connectors 300 are connected to each other to gain both the tolerance to foreign substance inclusion and the tolerance to tilt of the optical fibers 120, and this makes it possible to ensure communication quality.

Here, the installation of the third lenses 373 in the optical communication connector 300 makes it possible to shorten distances between the optical fibers 120 and the second lenses 371 while ensuring the diameter of light output from the second lenses 371.

Note that, in the case where shaped light L enters the optical communication connector 300, the second lenses 371 collect the light L at the third lenses 373, and the third lenses 373 collect the light L at the first lenses 363. The first lenses 363 collect the light at the cores 121.

[Optical Communication Cable and Optical Communication System]

In a way similar to the first embodiment, it is possible to configure the optical communication cable and the optical communication system by using the optical communication connectors 300.

Fourth Embodiment

An optical communication connector according to a fourth embodiment of the present technology will be described.

[Another Configuration of Optical Communication Connector]

Figure 17:
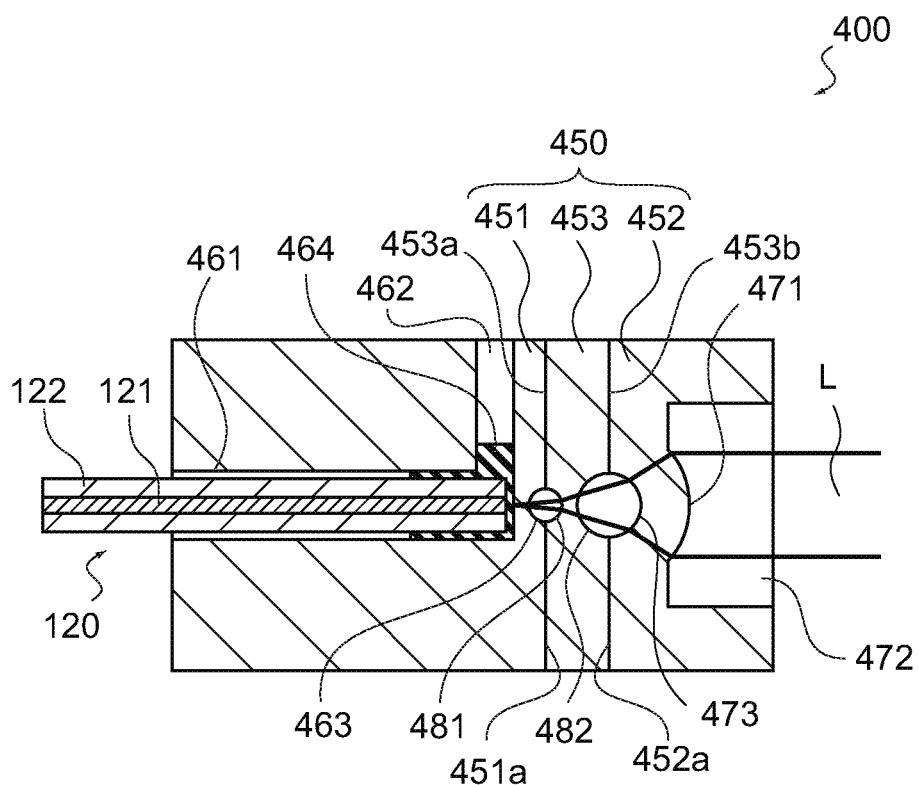
FIG. 17 is a cross-sectional view of an optical communication connector according to a fourth embodiment of the present technology.

FIG. 17 is a cross-sectional view of an optical communication connector 400 according to the fourth embodiment of the present technology. As illustrated in FIG. 17, the optical fibers 120 are connected to the optical communication connector 400. The number of optical fibers 120 may be one or more.

As illustrated in FIG. 17, the optical communication connector 400 includes a connector main body 450, and the connector main body 450 includes a first part 451, a second part 452, and a third part 453.

The first part 451 includes light-transmissive material that is similar to the first embodiment, and the first part 351 has optical fiber insertion holes 461, an adhesive injection hole 462, and first lenses 463.

The optical fiber insertion hole 461 is a hole into which the optical fiber 120 is inserted. The optical fiber insertion hole 161 extends from an end of the first part 451 opposite to the third part 453 to have a certain length.

The optical fiber insertion hole 461 is made for each of the optical fibers 120. The optical fibers 120 are inserted into the respective optical fiber insertion holes 461, and are fixed to the first part 451 with an adhesive 464. A light-transmissive adhesive is suitable for the adhesive 464, and the adhesive 264 may be refractive index matching material.

The adhesive injection hole 462 is a hole that communicates with the respective optical fiber insertion holes 461. The adhesive 464 is injected into the adhesive injection hole 462 and surrounds portions of the optical fibers 120.

The first lens 463 magnifies light L emitted from the core 121 of the optical fiber 120. The light L emitted from the optical fiber 120 passes through the adhesive 464 and the first part 451 and enters the first lens 463, and then the first lens 463 magnifies the light L.

The first lens 463 may be a concave lens that has a concave shape and that is provided on a junction surface 451*a*. The junction surface 451*a* is a junction surface of the first part 451 with the third part 453.

The first lens 463 is provided for each of the optical fibers 120. The first lens 463 are arrayed in such a manner that optical axes of light emitted from the respective optical fibers 120 are identical to centers of the respective first lenses 163.

The third part 453 is interposed between the first part 451 and the second part 452, and is joined to the first part 451 and the second part 452. The third part 453 includes third lenses 481 and fourth lenses 482. The third part 453 includes light-transmissive material such as glass, synthetic resin, or silicon material.

The third lens 481 magnifies light L output from the first lens 463. The third lens 481 may be a concave lens that has a concave shape and that is provided on a junction surface 453*a*. The junction surface 453*a* is a junction surface of the third part 453 with the first part 451.

The concave part constituting the third lens 481 and the concave part constituting the first lens 463 form a space that communicates with the both concave parts. This space is sealed with the first part 451 and the third part 453.

The third lens 481 is provided for each of the optical fibers 120. The third lenses 372 are arrayed in such a manner that optical axes of light output from the respective first lenses 463 are identical to centers of the respective third lenses 481.

The fourth lens 482 magnifies the light L output from the third lens 481. The fourth lens 482 may be a concave lens that has a concave shape and that is provided on a junction surface 453*b*. The junction surface 453*b* is a junction surface of the third part 453 with the second part 452.

The fourth lens 482 is provided for each of the optical fibers 120. The fourth lenses 482 are arrayed in such a manner that optical axes of light output from the respective third lenses 481 are identical to centers of the respective fourth lenses 482.

The second part 452 is joined to the third part 453, and the second part 452 includes second lenses 471, a light transmission space 472, and fifth lenses 473. The second part 452 includes light-transmissive material that is similar to the first embodiment.

As illustrated in FIG. 17, the fifth lens 473 magnifies light output from the fourth lens 482. The fifth lens 473 may be a concave lens that has a concave shape and that is provided on a junction surface 452*a*. The junction surface 452*a* is a junction surface of the second part 452 with the third part 453.

The concave part constituting the fifth lens 473 and the concave part constituting the fourth lens 482 form a space that communicates with the both concave parts. This space is sealed with the third part 453 and the second part 452.

The fifth lens 473 is provided for each of the optical fibers 120. The fifth lenses 473 are arrayed in such a manner that optical axes of light output from the respective fourth lenses 482 are identical to centers of the respective fifth lenses 473.

The second lens 471 shapes the light L incident from the fifth lens 473. The second lens 471 may shape the incident light into collimated light. Alternatively, the second lens 171 may shape the incident light into another type of light that is suitable for transmission.

The second lens 471 may be a convex lens that has a convex shape and that is provided on a side of the second part 452 opposite to the third part 453. The second lens 471 is provided for each of the optical fibers 120. The second lenses 471 are arrayed in such a manner that optical axes of light output from the respective fifth lenses 473 are identical to centers of the respective second lenses 471.

The light transmission space 472 is a space formed of a concave part provided on the second part 452 around the second lenses 471. The light L output from the second lenses 471 passes through the light transmission space 172.

The third part 453 may be joined to the first part 451 and the second part 452 may be joined to the third part 453 when the concave parts or convex parts of the third part 453 and the second part 452 fit into the convex parts or concave parts of the first part 451 and the third part 453 or when the third part 453 adheres to the first part 451 and the third part 453, for example.

As described above, the connector main body 450 defines the relative positions of the optical fibers 120, the first lenses 463, the second lenses 471, the third lenses 481, the fourth lenses 482, and the fifth lenses 473.

The optical communication connector 400 magnifies light emitted from the optical fibers 120 through the first lenses 463, the third lenses 481, the fourth lenses 482, and the fifth lenses 473 and then the magnified light enters the second lenses 471 that shape the light. This makes it possible to enlarge the diameter of the light output from the second lenses 471 even when the distances between the optical fibers 120 and the second lenses 471 are short.

This allows an optical communication connector set in which the two optical communication connectors 400 are connected to each other to gain both the tolerance to foreign substance inclusion and the tolerance to tilt of the optical fibers 120, and this makes it possible to ensure communication quality.

Here, the installation of the third lenses 481, the fourth lenses 482, and the fifth lenses 473 in the optical communication connector 400 makes it possible to further shorten the distances between the optical fibers 120 and the second lenses 471 while ensuring the diameter of light output from the second lenses 471.

Note that, in the case where shaped light L enters the optical communication connector 400, the second lens 471 collects the light L at the fifth lens 473, and the fifth lens 473 collects the light L at the fourth lens 482. The fourth lens 482 collects the light L at the third lens 481, and the third lens 481 collects the light L at the first lens 463. The first lens 463 collects the light at the core 121.

[Optical Communication Cable and Optical Communication System]

In a way similar to the first embodiment, it is possible to configure the optical communication cable and the optical communication system by using the optical communication connectors 400.

Fifth Embodiment

An optical communication connector according to a fifth embodiment of the present technology will be described.

[Another Configuration of Optical Communication Connector]

Figure 18:
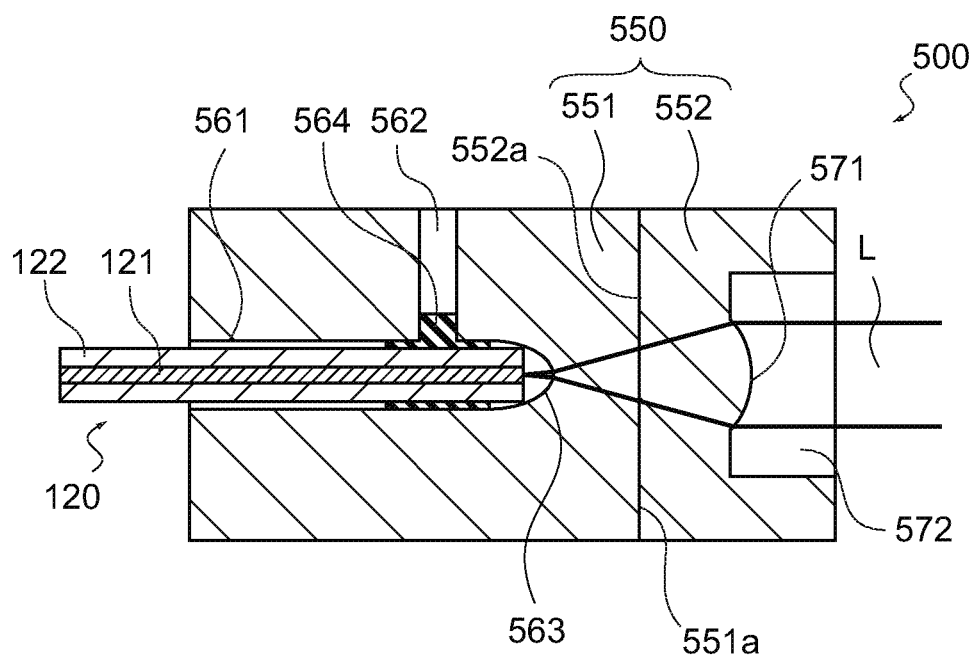
FIG. 18 is a cross-sectional view of an optical communication connector according to a fifth embodiment of the present technology.

FIG. 18 is a cross-sectional view of an optical communication connector 500 according to the fifth embodiment of the present technology. As illustrated in FIG. 18, the optical fibers 120 are connected to the optical communication connector 500. The number of optical fibers 120 may be one or more.

As illustrated in FIG. 18, the optical communication connector 500 includes a connector main body 550, and the connector main body 550 includes a first part 551 and a second part 552.

The first part 551 includes light-transmissive material that is similar to the first embodiment, and the first part 551 has optical fiber insertion holes 561, an adhesive injection hole 562, and first lenses 563.

The optical fiber insertion hole 561 is a hole into which the optical fiber 120 is inserted. The optical fiber insertion hole 561 extends from an end of the first part 551 opposite to the second part 552 to have a certain length.

The optical fiber insertion hole 561 is made for each of the optical fibers 120. The optical fibers 120 are inserted into the respective optical fiber insertion holes 561, and are fixed to the first part 551 with an adhesive 564. The adhesive 564 may be a light-transmissive adhesive, and the adhesive 564 may be refractive index matching material.

The adhesive injection hole 562 is a hole that communicates with the respective optical fiber insertion holes 561. The adhesive 564 is injected into the adhesive injection hole 562 and surrounds portions of the optical fibers 120.

The first lens 563 magnifies light emitted from the core 121 of the optical fiber 120. The first lens 563 is a concave lens obtained by forming a tip of the optical fiber insertion hole 561 into a concave shape.

The adhesive injection hole 562 is made in such a manner that the adhesive injection hole 562 communicates with the optical fiber insertion holes 561 at a position distant from the first lenses 563. This makes it possible to prevent the adhesive 564 from flowing into spaces between the optical fibers 120 and the first lenses 563 and changing optical properties.

The light L emitted from the optical fiber 120 passes through the space between the optical fiber 120 and the first lens 563 and enters the first lens 563, and then the first lens 563 magnifies the light L.

The first lens 563 is provided for each of the optical fibers 120. The first lenses 563 are arrayed in such a manner that optical axes of light emitted from the respective optical fibers 120 are identical to centers of the respective first lenses 563.

The second part 552 is joined to the first part 551, and the second part 552 includes second lenses 571 and a light transmission space 572. The second part 552 includes light-transmissive material that is similar to the first embodiment.

The second lens 571 shapes the light L incident from the first lens 563. The second lens 571 may shape the incident light into collimated light. Alternatively, the second lens 571 may shape the incident light into another type of light that is suitable for transmission.

The second lens 571 may be a convex lens that has a convex shape and that is provided on a side of the second part 552 opposite to the first part 551. The second lens 571 is provided for each of the optical fibers 120. The second lenses 571 are arrayed in such a manner that optical axes of light output from the respective first lenses 563 are identical to centers of the respective second lenses 571.

The light transmission space 572 is a space formed of a concave part provided on the second part 552 around the second lenses 571. The light L output from the second lenses 571 passes through the light transmission space 572.

The second part 552 may be joined to the first part 551 when the concave parts or convex parts of the second part 552 fit into the convex parts or concave parts of the first part 551 or when the second part 552 adheres to the first part 551, for example.

As described above, the connector main body 550 defines the relative positions of the optical fibers 120, the first lenses 563, and the second lenses 571.

The optical communication connector 500 magnifies light emitted from the optical fibers 120 through the first lenses 563 and then the magnified light enters the second lenses 571 that shape the light. This makes it possible to enlarge the diameter of the light output from the second lenses 571 even when the distances between the optical fibers 120 and the second lenses 571 are short.

This allows an optical communication connector set in which the two optical communication connectors 500 are connected to each other to gain both the tolerance to foreign substance inclusion and the tolerance to tilt of the optical fibers 120, and this makes it possible to ensure communication quality.

Note that, in the case where shaped light L enters the optical communication connector 500, the second lens 571 collects the light L at the first lens 563, and the first lens 563 collects the light L at the core 121.

Figure 19:
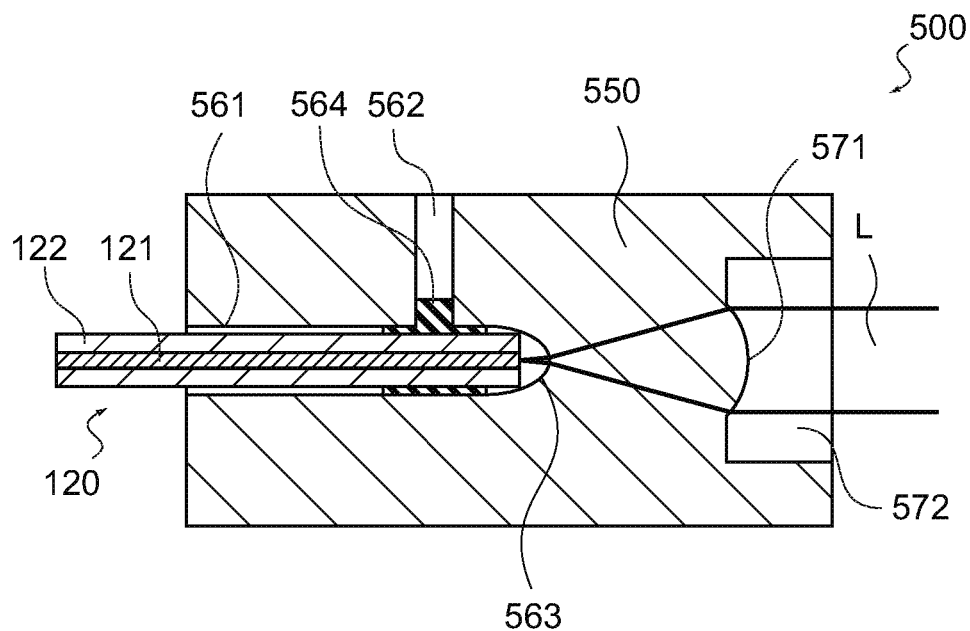
FIG. 19 is a cross-sectional view of an optical communication connector according to the fifth embodiment of the present technology.

In addition, the case where the connector main body 550 includes the first part 551 and the second part 552 has been described above. However, the connector main body 550 may include only one part. FIG. 19 is a schematic diagram illustrating an optical communication connector 500 in which a connector main body 550 includes only one part.

As illustrated in FIG. 19, the optical fiber insertion holes 561, the adhesive injection hole 562, the first lenses 563, the second lenses 571, and the light transmission space 572 may be included in the connector main body 550 constituted by only one part.

[Optical Communication Cable and Optical Communication System]

In a way similar to the first embodiment, it is possible to configure the optical communication cable and the optical communication system by using the optical communication connectors 500.

Sixth Embodiment

An optical communication connector according to a sixth embodiment of the present technology will be described.

[Another Configuration of Optical Communication Connector]

Figure 20:
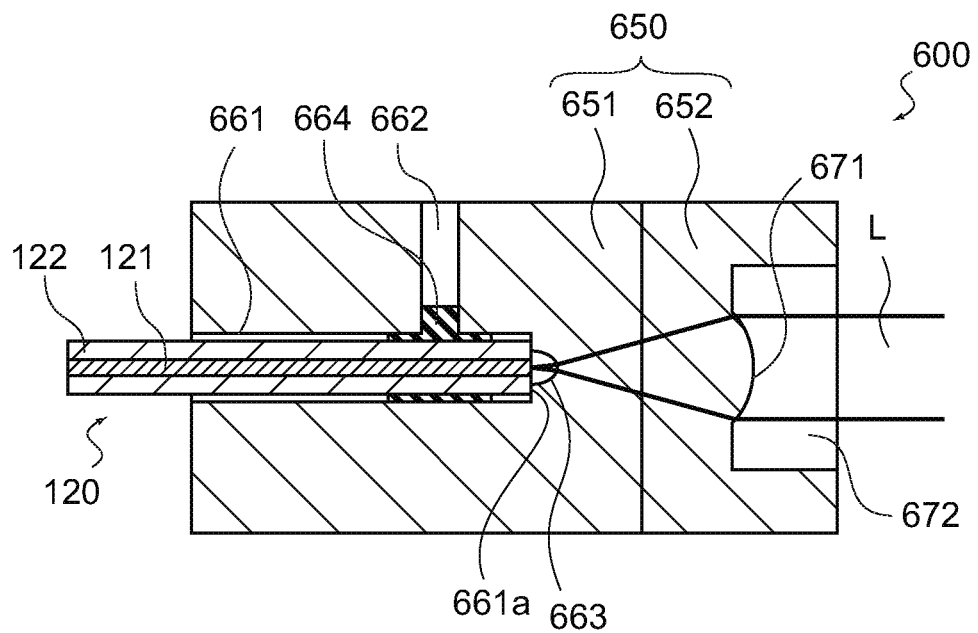
FIG. 20 is a cross-sectional view of an optical communication connector according to a sixth embodiment of the present technology.

FIG. 20 is a cross-sectional view of an optical communication connector 600 according to the sixth embodiment of the present technology. As illustrated in FIG. 20, the optical fibers 120 are connected to the optical communication connector 600. The number of optical fibers 120 may be one or more.

As illustrated in FIG. 20, the optical communication connector 600 includes a connector main body 650, and the connector main body 650 includes a first part 651 and a second part 652.

The first part 651 includes light-transmissive material that is similar to the first embodiment, and the first part 651 has optical fiber insertion holes 661, an adhesive injection hole 662, and first lenses 663.

The optical fiber insertion hole 661 is a hole into which the optical fiber 120 is inserted. The optical fiber insertion hole 161 extends from an end of the first part 651 opposite to the second part 652 to have a certain length.

The optical fiber insertion hole 661 is made for each of the optical fibers 120. The optical fibers 120 are inserted into the respective optical fiber insertion holes 661, and are fixed to the first part 651 with an adhesive 664. The adhesive 664 may be a light-transmissive adhesive, and the adhesive 664 may be refractive index matching material.

The adhesive injection hole 662 is a hole that communicates with the respective optical fiber insertion holes 661. The adhesive 664 is injected into the adhesive injection hole 662 and surrounds portions of the optical fibers 120.

The first lens 663 magnifies light L emitted from the core 121 of the optical fiber 120. As illustrated in FIG. 20, the first lens 663 is a concave lens obtained by forming a tip of the optical fiber insertion hole 661 into a concave shape.

An optical fiber contact surface 661*a* is provided at the tip of the optical fiber insertion hole 661 near the first lens 663. The optical fiber 120 is inserted into the optical fiber insertion hole 661 and is brought into contact with the optical fiber contact surface 661*a*.

The installation of the optical fiber contact surfaces 661*a* make it possible to prevent misalignment of the optical fibers 120 and to improve accuracy in positions of the optical fibers 120.

In addition, the adhesive injection hole 662 communicates with the optical fiber insertion holes 661 at a position distant from the first lenses 663. This makes it possible to prevent the adhesive 664 from flowing into spaces between the optical fibers 120 and the first lenses 663 and changing optical properties.

The light L emitted from the optical fiber 120 passes through the space between the optical fiber 120 and the first lens 663 and enters the first lens 663, and then the first lens 663 magnifies the light L.

The first lens 663 is provided for each of the optical fibers 120. The first lenses 663 are arrayed in such a manner that optical axes of light emitted from the respective optical fibers 120 are identical to centers of the respective first lenses 663.

The second part 652 is joined to the first part 651, and the second part 552 includes second lenses 671 and a light transmission space 672. The second part 652 includes light-transmissive material that is similar to the first embodiment.

The second lens 671 shapes the light L incident from the first lens 663. The second lens 671 may shape the incident light into collimated light. Alternatively, the second lens 671 may shape the incident light into another type of light that is suitable for transmission.

The second lens 671 may be a convex lens that has a convex shape and that is provided on a side of the second part 652 opposite to the first part 651. The second lens 671 is provided for each of the optical fibers 120. The second lens 671 are arrayed in such a manner that optical axes of light output from the respective first lenses 663 are identical to centers of the respective second lenses 671.

The light transmission space 672 is a space formed of a concave part provided on the second part 652 around the second lenses 671. The light L output from the second lenses 671 passes through the light transmission space 672.

The second part 652 may be joined to the first part 651 when the concave parts or convex parts of the second part 652 fit into the convex parts or concave parts of the first part 651 or when the second part 652 adheres to the first part 651, for example.

As described above, the connector main body 650 defines the relative positions of the optical fibers 120, the first lenses 663, and the second lenses 671.

The optical communication connector 600 magnifies light emitted from the optical fibers 120 through the first lenses 663 and then the magnified light enters the second lenses 671 that shape the light. This makes it possible to enlarge the diameter of the light output from the second lenses 671 even when the distances between the optical fibers 120 and the second lenses 671 are short.

This allows an optical communication connector set in which the two optical communication connectors 600 are connected to each other to gain both the tolerance to foreign substance inclusion and the tolerance to tilt of the optical fibers 120, and this makes it possible to ensure communication quality.

Note that, in the case where shaped light L enters the optical communication connector 600, the second lens 671 collects the light L at the first lens 663, and the first lens 663 collects the light L at the core 121.

Figure 21:
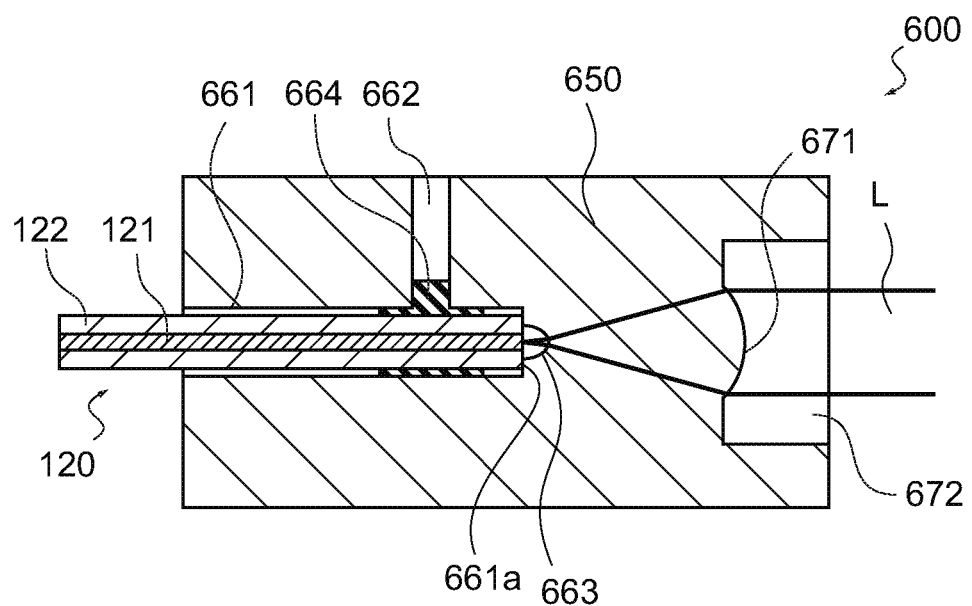
FIG. 21 is a cross-sectional view of an optical communication connector according to the sixth embodiment of the present technology.

In addition, the case where the connector main body 650 includes the first part 651 and the second part 652 has been described above. However, the connector main body 650 may include only one part. FIG. 21 is a schematic diagram illustrating an optical communication connector 600 in which a connector main body 650 includes only one part.

As illustrated in FIG. 21, the optical fiber insertion holes 661, the adhesive injection hole 662, the first lenses 663, the optical fiber contact surfaces 661*a*, the second lenses 671, and the light transmission space 672 may be included in the connector main body 650 constituted by only one part.

[Optical Communication Cable and Optical Communication System]

In a way similar to the first embodiment, it is possible to configure the optical communication cable and the optical communication system by using the optical communication connectors 600.

Seventh Embodiment

An optical communication connector according to a seventh embodiment of the present technology will be described.

[Another Configuration of Optical Communication Connector]

Figure 22:
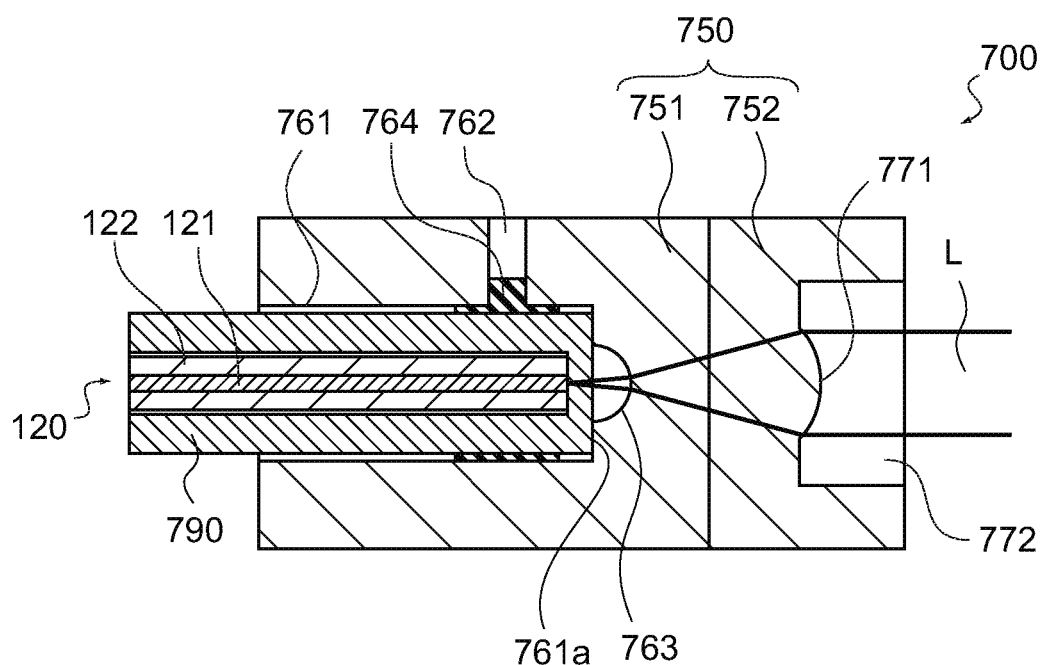
FIG. 22 is a cross-sectional view of an optical communication connector according to a seventh embodiment of the present technology.

FIG. 22 is a cross-sectional view of an optical communication connector 700 according to the seventh embodiment of the present technology. As illustrated in FIG. 22, the optical fibers 120 are connected to the optical communication connector 700. The number of optical fibers 120 may be one or more.

As illustrated in FIG. 22, the optical communication connector 700 includes a connector main body 750 and fixed members 790. The connector main body 750 includes a first part 751 and a second part 752.

The first part 751 includes light-transmissive material that is similar to the first embodiment, and the first part 751 has optical fiber insertion holes 761, an adhesive injection hole 762, and first lenses 763.

As illustrated in FIG. 22, the optical fiber insertion hole 761 is a hole into which the optical fiber 120 and the fixed member 790 are inserted, and the optical fiber insertion hole 761 extends from an end of the first part 751 opposite to the second part 752 to have a certain length.

The optical fiber insertion hole 761 is made for each of the optical fibers 120. The adhesive injection hole 762 is a hole that communicates with the respective optical fiber insertion holes 761.

The first lens 763 magnifies light emitted from the core 121 of the optical fiber 120. As illustrated in FIG. 22, the first lens 763 is a concave lens obtained by forming a tip of the optical fiber insertion hole 761 into a concave shape. A fixed member contact surface 761*a* is provided at the tip of the optical fiber insertion hole 761 near the first lens 763.

The fixed member 790 includes light-transmissive material, and the fixed member 790 is configured in such a manner that it is possible to insert the optical fiber 120 into the fixed member 790. The fixed member 790 is brought into contact with the fixed member contact surface 761*a* in a state where the optical fiber 120 is inserted in the fixed member 790, and this makes it possible to define a position of the optical fiber 120 relative to the first part 751.

The fixed members 790 are fixed to the first part 751 with an adhesive 764 that is injected in the adhesive injection hole 762. The adhesive 764 may be a light-transmissive adhesive, and the adhesive 764 may be refractive index matching material. By using the fixed member 790, it is possible to enlarge the area of the fixed member contact surface 761*a* and further improve accuracy in position of the optical fiber 120.

The light L emitted from the optical fiber 120 passes through the fixed member 790 and a space between the fixed member 790 and the first lens 763 and enters the first lens 763, and then the first lens 763 magnifies the light L.

The first lens 763 is provided for each of the optical fibers 120. The first lenses 763 are arrayed in such a manner that optical axes of light emitted from the respective optical fibers 120 are identical to centers of the respective first lenses 763.

The second part 752 is joined to the first part 751, and the second part 752 includes second lenses 771 and a light transmission space 772. The second part 752 includes light-transmissive material that is similar to the first embodiment.

As illustrated in FIG. 22, the second lens 771 shapes the light incident from the first lens 763. The second lens 771 may shape the incident light into collimated light. Alternatively, the second lens 771 may shape the incident light into another type of light that is suitable for transmission.

The second lens 771 may be a convex lens that has a convex shape and that is provided on a side of the second part 752 opposite to the first part 751. The second lens 771 is provided for each of the optical fibers 120. The second lens 771 are arrayed in such a manner that optical axes of light output from the respective first lenses 763 are identical to centers of the respective second lenses 163.

The light transmission space 772 is a space formed of a concave part provided on the second part 752 around the second lenses 771. The light L output from the second lenses 771 passes through the light transmission space 172.

The second part 752 may be joined to the first part 751 when the concave parts or convex parts of the second part 752 fit into the convex parts or concave parts of the first part 751 or when the second part 752 adheres to the first part 751, for example.

As described above, the connector main body 750 defines the relative positions of the optical fibers 120, the first lenses 763, and the second lenses 771.

The optical communication connector 700 magnifies light emitted from the optical fibers 120 through the first lenses 763 and then the magnified light enters the second lenses 771 that shape the light. This makes it possible to enlarge the diameter of the light output from the second lenses 771 even when the distances between the optical fibers 120 and the second lenses 771 are short.

This allows an optical communication connector set in which the two optical communication connectors 700 are connected to each other to gain both the tolerance to foreign substance inclusion and the tolerance to tilt of the optical fibers 120, and this makes it possible to ensure communication quality.

Note that, in the case where shaped light L enters the optical communication connector 700, the second lens 771 collects the light L at the first lens 763, and the first lens 763 collects the light L at the core 121.

Figure 23:
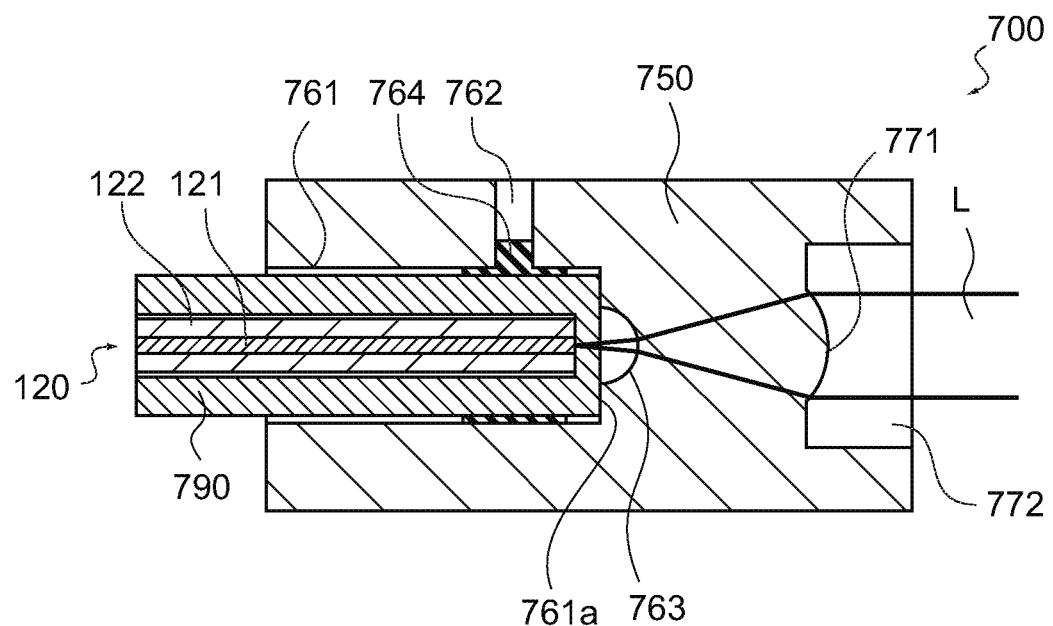
FIG. 23 is a cross-sectional view of an optical communication connector according to the seventh embodiment of the present technology.

In addition, the case where the connector main body 750 includes the first part 751 and the second part 752 has been described above. However, the connector main body 750 may include only one part. FIG. 23 is a schematic diagram illustrating an optical communication connector 700 in which a connector main body 750 includes only one part.

As illustrated in FIG. 23, the optical fiber insertion holes 761, the adhesive injection hole 762, the first lenses 763, the fixed member contact surfaces 761a, the second lenses 771, and the light transmission space 772 may be included in the connector main body 750 constituted by only one part.

[Optical Communication Cable and Optical Communication System]

In a way similar to the first embodiment, it is possible to configure the optical communication cable and the optical communication system by using the optical communication connectors 700.

Eighth Embodiment

An optical communication connector according to an eighth embodiment of the present technology will be described.

[Another Configuration of Optical Communication Connector]

Figure 24:
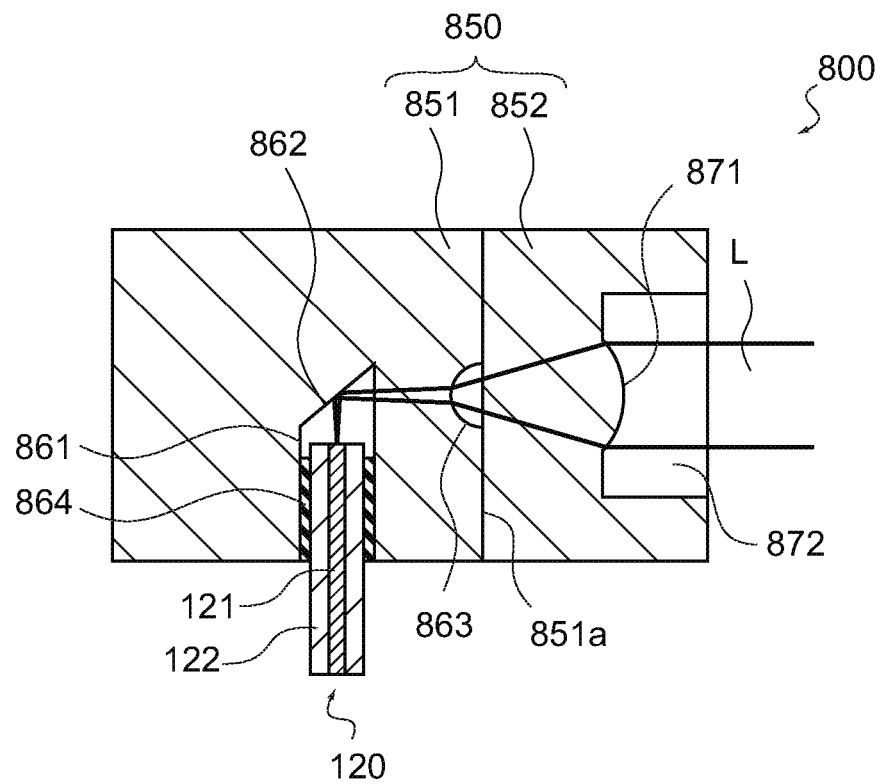
FIG. 24 is a cross-sectional view of an optical communication connector according to an eighth embodiment of the present technology.

FIG. 24 is a cross-sectional view of an optical communication connector 800 according to the fifth embodiment of the present technology. As illustrated in FIG. 24, the optical fibers 120 are connected to the optical communication connector 800. The number of optical fibers 120 may be one or more.

As illustrated in FIG. 24, the optical communication connector 800 includes a connector main body 850. The connector main body 850 includes a first part 851 and a second part 852.

The first part 851 includes light-transmissive material that is similar to the first embodiment, and the first part 851 has optical fiber insertion holes 861, reflectors 862, and first lenses 863.

The optical fiber insertion hole 861 extends in a direction different from the direction of the first lens 863, and the reflector 862 is provided at a tip of the optical fiber insertion hole 861. The optical fiber insertion hole 861 is made for each of the optical fibers 120. The optical fibers 120 are inserted into the respective optical fiber insertion holes 861, and are fixed to the first part 351 with an adhesive 864. The adhesive 864 may be a light-transmissive adhesive, and the adhesive 564 may be refractive index matching material.

The reflector 862 reflects light emitted from the core 121 of the optical fiber 120 toward the first lens 863. The reflector 862 may be a surface made of material of the first part 851, or may be a surface made of a light reflection member such as metal provided at the tip of the optical fiber insertion hole 861.

The first lens 863 magnifies light emitted from the core 121 of the optical fiber 120. As illustrated in FIG. 24, the light L emitted from the optical fiber 120 is reflected by the reflector 862 and enters the first lens 863, and the first lens 863 magnifies the light L.

The first lens 863 may be a concave lens that has a concave shape and that is provided on a junction surface 851a. The junction surface 851a is a junction surface of the first part 851 with the second part 852. The concave part constituting the first lens 863 is sealed with the second part 852.

The first lens 863 is provided for each of the optical fibers 120. The first lenses 863 are arrayed in such a manner that optical axes of light emitted from the respective optical fibers 120 are identical to centers of the respective first lenses 863 via the respective reflectors 862.

The second part 852 is joined to the first part 851, and the second part 852 includes second lenses 871 and a light transmission space 872. The second part 852 includes light-transmissive material that is similar to the first embodiment.

The second lens 871 shapes the light L incident from the first lens 863. The second lens 871 may shape the incident light into collimated light. Alternatively, the second lens 171 may shape the incident light into another type of light that is suitable for transmission.

The second lens 871 may be a convex lens that is formed of a convex part provided on a side of the second part 852 opposite to the first part 851. The second lens 871 is provided for each of the optical fibers 120. The second lenses 871 are arrayed in such a manner that optical axes of light output from the respective first lenses 863 are identical to centers of the respective second lenses 871.

The light transmission space 872 is a space formed of a concave part provided on the second part 852 around the second lenses 871. The light L output from the second lenses 871 passes through the light transmission space 872.

The second part 852 may be joined to the first part 851 when the concave parts or convex parts of the second part 852 fit into the convex parts or concave parts of the first part 851 or when the second part 852 adheres to the first part 851, for example.

As described above, the connector main body 850 defines the relative positions of the optical fibers 120, the first lenses 863, and the second lenses 871.

The optical communication connector 800 magnifies light emitted from the optical fibers 120 through the first lenses 863 and then the magnified light enters the second lenses 871 that shape the light. This makes it possible to enlarge the diameter of the light output from the second lenses 871 even when the optical paths between the optical fibers 120 and the second lenses 871 are short.

This allows an optical communication connector set in which the two optical communication connectors 800 are connected to each other to gain both the tolerance to foreign substance inclusion and the tolerance to tilt of the optical fibers 120, and this makes it possible to ensure communication quality.

In addition, the installation of the reflectors 862 makes it possible to improve a degree of freedom of designing the optical communication connector 800.

Note that, in the case where shaped light L enters the optical communication connector 800, the second lens 871 collects the light L at the first lens 863, and the first lens 863 collects the light L at the core 121 via the reflector 862.

[Optical Communication Cable and Optical Communication System]

In a way similar to the first embodiment, it is possible to configure the optical communication cable and the optical communication system by using the optical communication connectors 800.

Ninth Embodiment

An optical communication connector according to a ninth embodiment of the present technology will be described.

[Another Configuration of Optical Communication Connector]

According to the respective embodiments described above, the optical fibers are connected to the optical communication connector. However, it is also possible to mount photonic devices on the optical communication connector instead of the optical fibers.

Figure 25:
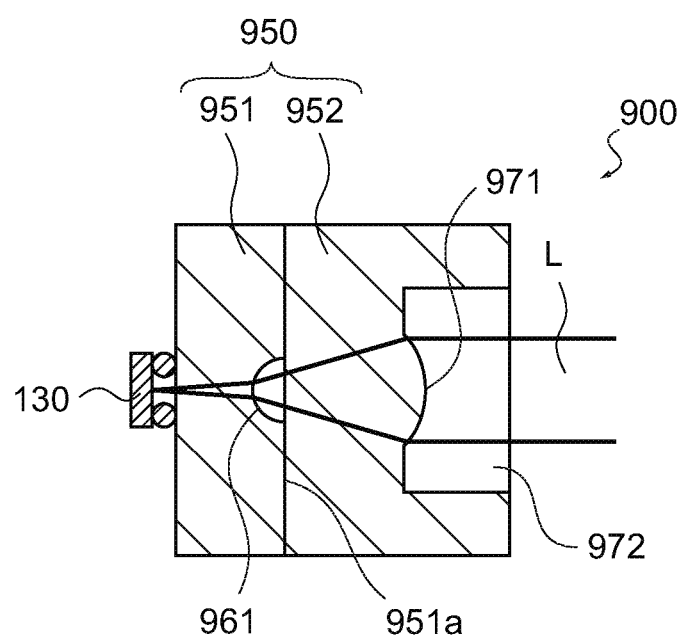
FIG. 25 is a cross-sectional view of an optical communication connector according to a ninth embodiment of the present technology.

FIG. 25 is a cross-sectional view of an optical communication connector 900 according to the ninth embodiment of the present technology. As illustrated in FIG. 25, photonic devices 130 are mounted on the optical communication connector 900.

The photonic device 130 is a laser element such as a vertical-cavity surface-emitting laser (VCSEL), a light-emitting element such as a light-emitting diode (LED), or a light receiving element such as a photodiode (PD). The number of photonic devices mounted on the optical communication connector 900 may be one or more.

As illustrated in FIG. 25, the optical communication connector 900 includes a connector main body 950, and the connector main body 950 includes a first part 951 and a second part 952.

The first part 951 includes light-transmissive material that is similar to the first embodiment, and the first part 951 includes first lenses 961.

The first lens 961 magnifies light L emitted from the photonic device 130. As illustrated in FIG. 25, the light L emitted from the photonic device 130 passes through the first part 951 and enters the first lens 961, and then the first lens 961 magnifies the light L.

The first lens 961 may be a concave lens that has a concave shape and that is provided on a junction surface 951a. The junction surface 951a is a junction surface of the first part 951 with the second part 952. The concave part constituting the first lens 961 is sealed with the second part 952.

The first lens 961 is provided for each of the photonic devices 130. The first lenses 961 are arrayed in such a manner that optical axes of light emitted from the respective photonic devices 130 are identical to centers of the respective first lenses 961.

The second part 952 is joined to the first part 951, and the second part 952 includes second lenses 971 and a light transmission space 972. The second part 952 includes light-transmissive material that is similar to the first embodiment.

The second lens 971 shapes the light L incident from the first lens 961. The second lens 971 may shape the incident light into collimated light. Alternatively, the second lens 171 may shape the incident light into another type of light that is suitable for transmission.

The second lens 971 may be a convex lens that has a convex shape and that is provided on a side of the second part 952 opposite to the first part 951. The second lens 971 is provided for each of the photonic devices 130. The second lenses 971 are arrayed in such a manner that optical axes of light output from the respective first lenses 961 are identical to centers of the respective second lenses 971.

The light transmission space 972 is a space formed of a concave part provided on the second part 952 around the second lenses 971. The light L output from the second lenses 971 passes through the light transmission space 972.

The second part 952 may be joined to the first part 951 when the concave parts or convex parts of the second part 952 fit into the convex parts or concave parts of the first part 951 or when the second part 952 adheres to the first part 951, for example.

As described above, the connector main body 950 defines the relative positions of the photonic devices 130, the first lenses 961, and the second lenses 971.

The optical communication connector 900 magnifies light emitted from the photonic devices 130 through the first lenses 961 and then the magnified light enters the second lenses 971 that shape the light. This makes it possible to enlarge the diameter of the light output from the second lenses 971 even when the distances between the photonic devices 130 and the second lenses 971 are short.

This allows an optical communication connector set in which the two optical communication connectors 900 are connected to each other to gain both the tolerance to foreign substance inclusion and the tolerance to tilt of the photonic devices 130, and this makes it possible to ensure communication quality.

Note that, in the case where shaped light L enters the optical communication connector 900, the second lens 971 collects the light L at the first lens 961, and the first lens 961 collects the light L at the photonic device 130.

[Optical Communication System]

In a way similar to the first embodiment, it is possible to configure the optical communication system by using the optical communication connectors 900. For example, with regard to the electronic apparatus 11 (see FIG. 13), the light-emitting section 14 and the light-receiving section 15 may be directly connected to the optical communication connector 100A without using the optical transmission line 16 or the optical transmission line 17. Such a configuration may be implemented by the optical communication connector 900.

Tenth Embodiment

An optical communication connector according to a tenth embodiment of the present technology will be described.

[Another Configuration of Optical Communication Connector]

Figure 26:
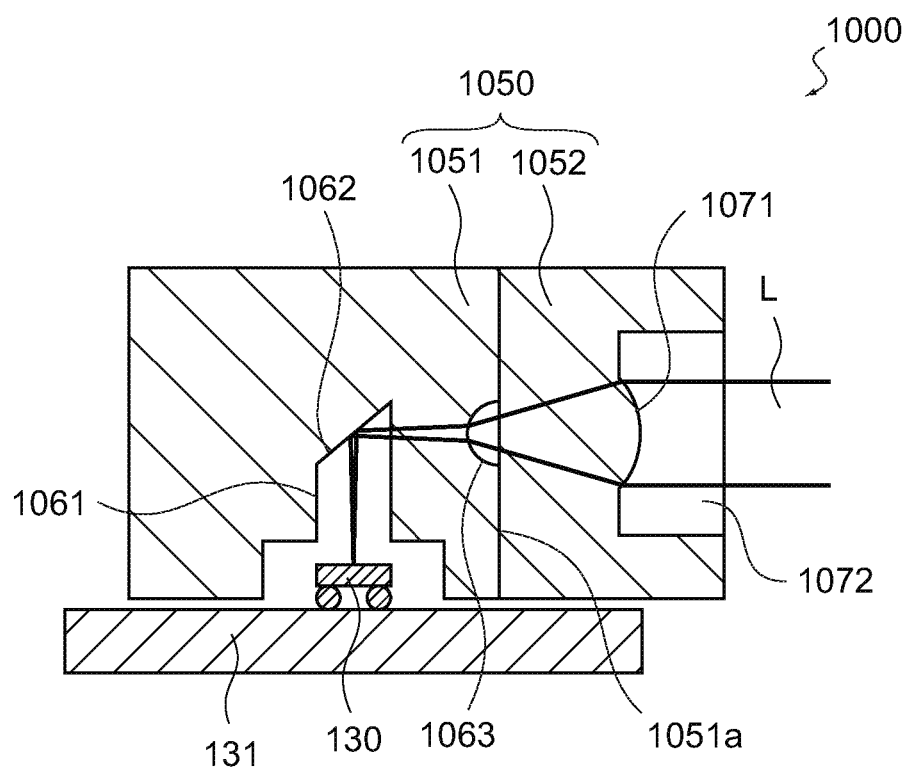
FIG. 26 is a cross-sectional view of an optical communication connector according to a tenth embodiment of the present technology.

FIG. 26 is a cross-sectional view of an optical communication connector 1000 having another configuration according to the present technology. As illustrated in FIG. 26, the optical communication connector 1000 includes the photonic devices 130 mounted on a fixed substrate 131.

The number of photonic devices 130 disposed in the optical communication connector 1000 may be one or more. The fixed substrate 131 is fixed to the optical communication connector 1000 with an adhesive or the like. In addition, the fixed substrate 131 may be fixed to a casing that is placed on the outside of a connector main body 1050 in such a manner that relative positions of the connector main body 1050 and the fixed substrate 131 are aligned.

As illustrated in FIG. 26, the optical communication connector 1000 includes the connector main body 1050, and the connector main body 1050 includes a first part 1051 and a second part 1052.

The first part 1051 includes light-transmissive material, and the first part 1051 has openings 1061, reflectors 1062, and first lenses 1063.

The opening 1061 is an opening made in the first part 1051. The reflector 1062 is provided at a tip of the opening 1061.

The reflector 1062 reflects light emitted from the photonic device 130 toward the first lens 1063. The reflector 1062 may be a surface made of material of the first part 1051, or may be a surface made of a light reflection member such as metal provided at the tip of the opening 1061.

The first lens 1063 magnifies light emitted from the photonic device 130. As illustrated in FIG. 26, the light L emitted from the photonic device 130 is reflected by the reflector 1062 and enters the first lens 1063, and then the first lens 1063 magnifies the light L.

The first lens 1063 may be a concave lens that has a concave shape and that is provided on a junction surface 1051a. The junction surface 951a is a junction surface of the first part 1051 with the second part 1052. The concave part constituting the first lens 1063 is sealed with the second part 1052.

The first lens 1063 is provided for each of the photonic devices 130. The first lenses 1063 are arrayed in such a manner that optical axes of light emitted from the respective photonic devices 130 are identical to centers of the respective first lenses 1063 via the respective reflectors 1062.

The second part 1052 is joined to the first part 1051, and the second part 1052 includes second lenses 1071 and a light transmission space 1072. The second part 1052 includes light-transmissive material that is similar to the first embodiment.

The second lens 1071 shapes the light L incident from the first lens 1063. The second lens 1071 may shape the incident light into collimated light. Alternatively, the second lens 171 may shape the incident light into another type of light that is suitable for transmission.

The second lens 1071 may be a convex lens that has a convex shape and that is provided on a side of the second part 1052 opposite to the first part 1051. The second lens 1071 is provided for each of the photonic devices 130. The second lenses 1071 are arrayed in such a manner that optical axes of light output from the respective first lenses 1063 are identical to centers of the respective second lenses 1071.

The light transmission space 1072 is a space formed of a concave part provided on the second part 1052 around the second lenses 1071. The light L output from the second lenses 1071 passes through the light transmission space 1072.

The second part 1052 may be joined to the first part 1051 when the concave parts or convex parts of the second part 1052 fit into the convex parts or concave parts of the first part 1051 or when the second part 1052 adheres to the first part 1051, for example.

As described above, the connector main body 1050 defines the relative positions of the photonic devices 130, the first lenses 1063, and the second lenses 1071.

The optical communication connector 1000 magnifies light emitted from the photonic devices 130 through the first lenses 1063 and then the magnified light enters the second lenses 1071 that shape the light. This makes it possible to enlarge the diameter of the light output from the second lenses 1071 even when the optical paths between the photonic devices 130 and the second lenses 1071 are short.

This allows an optical communication connector set in which the two optical communication connectors 1000 are connected to each other to gain both the tolerance to foreign substance inclusion and the tolerance to tilt of the photonic devices 130, and this makes it possible to ensure communication quality.

Note that, in the case where shaped light L enters the optical communication connector 1000, the second lens 1071 collects the light L at the first lens 1063, and the first lens 1063 collects the light L at the photonic device 130 via the reflector 1062.

[Optical Communication System]

With regard to the electronic apparatus 11 (see FIG. 13), the light-emitting section 14 and the light-receiving section 15 may be directly connected to the optical communication connector 100A without using the optical transmission line 16 or the optical transmission line 17 in a way similar to the eighth embodiment. This makes it possible to implement the optical communication system by using the optical communication connectors 1000.

(Optical Communication Connectors according to respective Embodiments)

The optical communication connectors according to the respective embodiments described above may be connected to each other, and may be connected to optical communication connectors according to other embodiments. For example, it is possible to connect the optical communication connector 100 to the optical communication connector 200.

In addition, each of the optical communication systems and the optical communication cables according to the present technology includes at least two optical communication connectors. The optical communication connectors may be optical communication connectors according to different embodiments.

Note that, the present technology may also be configured as below.

(1)

An optical communication connector capable of spatial optical coupling, the optical communication connector including:

a first lens that magnifies light emitted from a light emitter; and a second lens that shapes light incident from the first lens and outputs the shaped light.

(2)

The optical communication connector according to (1), in which the second lens shapes the light output from the first lens into collimated light.

(3)

The optical communication connector according to (1) or (2), further including a connector main body that defines relative positions of the light emitter, the first lens, and the second lens.

(4)

The optical communication connector according to (3), in which the light emitter is an optical fiber, the connector main body has a hole into which the optical fiber is inserted, and the optical fiber is fixed to the connector main body with an adhesive injected in the hole.

(5)

The optical communication connector according to (3), in which the light emitter is a light-emitting element.

(6)

The optical communication connector according to any one of (3) to (5), in which the connector main body includes a first part to which the light emitter is fixed and a second part that includes the second lens.

(7)

The optical communication connector according to (6), in which the first lens is a concave lens that has a concave shape and that is provided on a junction surface of the first part with the second part, and the second lens is a convex lens that has a convex shape and that is provided on a side of the second part opposite to the first part.

(8)

The optical communication connector according to (6), in which the first lens is a concave lens that has a concave shape and that is provided on a junction surface of the second part with the first part, and the second lens is a convex lens that has a convex shape and that is provided on a side of the second part opposite to the first part.

(9)

The optical communication connector according to (6), in which the first lens is a concave lens that has a concave shape and that is provided on a junction surface of the first part with the second part, the second lens is a convex lens that has a convex shape and that is provided on a side of the second part opposite to the first part, and the optical communication connector further includes a third lens that has a concave shape and that is provided on a junction surface of the second part with the first part, the third lens magnifying the light incident from the first lens and outputting the magnified light to the second lens.

(10)

The optical communication connector according to (6), further including a third part that is disposed between the first part and the second part and that includes a third lens and a fourth lens, the third lens magnifying the light incident from the first lens, the fourth lens magnifying light incident from the third lens, in which the second part further includes a fifth lens that magnifies light incident from the fourth lens and outputs the magnified light to the second lens, the first lens is a concave lens that has a concave shape and that is provided on a junction surface of the first part with the third part, the second lens is a convex lens that has a convex shape and that is provided on a side of the second part opposite to the third part, the third lens is a concave lens that has a concave shape and that is provided on a junction surface of the third part with the first part, the fourth lens is a concave lens that has a concave shape and that is provided on a junction surface of the third part with the second part, and the fifth lens is a concave lens that has a concave shape and that is provided on a junction surface of the second part with the third part.

(11)

The optical communication connector according to (4), in which the first lens is a concave lens that has a concave shape and that is provided on a tip of the hole, and the second lens is a convex lens that has a convex shape and that is provided on the connector main body.

(12)

The optical communication connector according to (11), further including a contact surface that is provided on the tip of the hole near the first lens, and that is brought into contact with the optical fiber.

(13)

The optical communication connector according to (11), further including:

a fixed member into which the optical fiber is inserted; and a contact surface that is provided on the tip of the hole near the first lens, and that is brought into contact with the fixed member.

(14)

The optical communication connector according to any one of (3) to (13), in which the connector main body includes a reflector that reflects the light emitted from the light emitter toward the first lens.

(15)

The optical communication connector according to (7), in which the second part seals a concave part constituting the first lens.

(16)

An optical communication connector capable of spatial optical coupling, the optical communication connector including:

a first lens that collects shaped incident light; and a second lens that collects light incident from the first lens at a light receiver.

(17)

An optical transmitter including:

a light emitter; and an optical communication connector capable of spatial optical coupling, the optical communication connector including a first lens that magnifies light emitted from a light emitter, and a second lens that shapes light incident from the first lens and outputs the shaped light.

(18)

An optical receiver including:

a light receiver; and an optical communication connector capable of spatial optical coupling, the optical communication connector including a first lens that collects shaped incident light, and a second lens that collects light incident from the first lens at the light receiver.

(19)

An optical communication system including:

a first optical communication connector capable of spatial optical coupling, the first optical communication connector including a first lens that magnifies light emitted from a light emitter, and a second lens that shapes light incident from the first lens and outputs the shaped light; and a second optical communication connector that is detachable and attachable from and to the first optical connector and that is capable of spatial optical coupling, the second optical communication connector including a third lens that collects light incident from the second lens, and a fourth lens that collects light incident from the third lens at a light receiver.

(20)

An optical communication cable including:

an optical fiber;

a first optical communication connector capable of spatial optical coupling, the first optical communication connector including a first lens on which shaped light is incident, and a second lens that collects light incident from the first lens at the optical fiber; and a second optical communication connector capable of spatial optical coupling, the second optical communication connector including a third lens that magnifies light incident from the optical fiber, and a fourth lens that shapes light incident from the third lens, and outputs the shaped light.

REFERENCE SIGNS LIST

10 optical communication system
50 optical communication cable
100, 200, 300, 400, 500, 600, 700, 800, 900, 100
120 optical fiber
130 photonic device 150, 250, 350, 450, 550, 650, 750, 850, 950, 1050 connector main body
163, 271, 363, 463, 563, 663, 763, 863, 963, 1063 first lens
171, 272, 371, 471, 571, 671, 771, 871, 971, 1071 second lens
373, 481 third lens
482 fourth lens
473 fifth lens

The invention claimed is:

1. An optical communication connector capable of spatial optical coupling, the optical communication connector comprising:
a first lens configured to magnify light emitted from a light emitter;
a second lens configured to:
magnify light incident from the first lens; and
output the magnified light incident from the first lens;
a third lens configured to:
shape light incident from the second lens; and
output the shaped light; and
a connector main body that defines relative positions of the light emitter, the first lens, the second lens, and the third lens, wherein
the connector main body includes:
a first part to which the light emitter is fixed; and
a second part that includes the third lens,
the first lens is a concave lens that has a concave shape,
the first lens is on a junction surface of the first part with the second part,
the second lens has a concave shape,
the second lens is on a junction surface of the second part with the first part,
the third lens is a convex lens that has a convex shape, and
the third lens is on a side of the second part opposite to the first part.

2. The optical communication connector according to claim 1, wherein the third lens is further configured to shape the light incident from the first lens into a collimated light.

3. The optical communication connector according to claim 1, wherein
the light emitter is an optical fiber,
the connector main body has a hole into which the optical fiber is inserted, and
the optical fiber is fixed to the connector main body with an adhesive injected in the hole.

4. The optical communication connector according to claim 1, wherein the light emitter is a light-emitting element.

5. The optical communication connector according to claim 1, further comprising
a third part between the first part and the second part, wherein
the third part includes
a fourth lens configured to magnify light incident from the second lens,
the second part further includes a fifth lens configured to:
magnify light incident from the fourth lens; and
output the magnified light incident from the fourth lens to the third lens,
the fourth lens is a concave lens that has a concave shape,
the fourth lens is on a junction surface of the third part with the second part,
the fifth lens is a concave lens that has a concave shape, and
the fifth lens is on a junction surface of the second part with the third part.

6. The optical communication connector according to claim 1, wherein the connector main body further includes a reflector configured to reflect the light emitted from the light emitter toward the first lens.

7. The optical communication connector according to claim 1, wherein the second part seals a concave part constituting the first lens.

8. An optical communication connector capable of spatial optical coupling, wherein the optical communication connector comprises:
a first lens configured to magnify light emitted from a light emitter, wherein the light emitter is an optical fiber;
a second lens configured to:
magnify light incident from the first lens; and
output the magnified light incident from the first lens;
a third lens configured to:
shape light incident from the second lens; and
output the shaped light; and
a connector main body that defines relative positions of the light emitter, the first lens, the second lens, and the third lens, wherein
the connector main body includes a hole into which the optical fiber is inserted,
the optical fiber is fixed to the connector main body with an adhesive injected in the hole,
the first lens is a concave lens that has a concave shape,
the first lens is on a tip of the hole,
the second lens has a concave shape,
the third lens is a convex lens that has a convex shape, and
each of the second lens and the third lens is on the connector main body.

9. The optical communication connector according to claim 8, further comprising a contact surface on the tip of the hole near the first lens, wherein the contact surface is brought into contact with the optical fiber.

10. The optical communication connector according to claim 8, further comprising:
a fixed member into which the optical fiber is inserted; and
a contact surface on the tip of the hole near the first lens, wherein the contact surface is brought into contact with the fixed member.

11. An optical communication connector capable of spatial optical coupling, the optical communication connector comprising:
a first lens configured to collect shaped incident light;
a second lens configured to collect light incident from the first lens;
a third lens configured to collect light incident from the second lens at a light receiver; and
a connector main body that defines relative positions of the light receiver, the first lens, the second lens, and the third lens, wherein
the connector main body includes:
a first part to which the light receiver is fixed; and
a second part that includes the first lens,
the first lens is a convex lens that has a convex shape,
the first lens is on a side of the second part opposite to the first part,
the second lens has a concave shape,
the second lens is on a junction surface of the second part with the first part, the third lens is a concave lens that has a concave shape, and
the third lens is on a junction surface of the first part with the second part.

12. An optical transmitter, comprising:
a light emitter; and
an optical communication connector capable of spatial optical coupling, wherein the optical communication connector includes:
a first lens configured to magnify light emitted from the light emitter;
a second lens configured to:
magnify light incident from the first lens; and
output the magnified light incident from the first lens;
a third lens configured to:
shape light incident from the second lens; and
output the shaped light; and
a connector main body that defines relative positions of the light emitter, the first lens, the second lens, and the third lens, wherein
the connector main body includes:
a first part to which the light emitter is fixed; and
a second part that includes the third lens,
the first lens is a concave lens that has a concave shape,
the first lens is on a junction surface of the first part with the second part,
the second lens has a concave shape,
the second lens is on a junction surface of the second part with the first part,
the third lens is a convex lens that has a convex shape, and
the third lens is on a side of the second part opposite to the first part.

13. An optical receiver, comprising:
a light receiver; and
an optical communication connector capable of spatial optical coupling, wherein
the optical communication connector includes:
a first lens configured to collect shaped incident light;
a second lens configured to collect light incident from the first lens; and
a third lens configured to collect light incident from the second lens at the light receiver; and
a connector main body that defines relative positions of the light receiver, the first lens, the second lens, and the third lens, wherein
the connector main body includes:
a first part to which the light receiver is fixed; and
a second part that includes the first lens,
the first lens is a convex lens that has a convex shape,
the first lens is on a side of the second part opposite to the first part,
the second lens has a concave shape,
the second lens is on a junction surface of the second part with the first part,
the third lens is a concave lens that has a concave shape, and
the third lens is on a junction surface of the first part with the second part.

14. An optical communication system, comprising:
a first optical communication connector capable of spatial optical coupling, wherein the first optical communication connector includes:
a first lens configured to magnify light emitted from a light emitter;
a second lens configured to:
shape light incident from the first lens; and
output the shaped light; and
a connector main body that defines relative positions of the light emitter, the first lens, and the second lens, wherein the connector main body includes:
a first part to which the light emitter is fixed; and
a second part that includes the second lens, wherein
the first lens is a concave lens that has a concave shape,
the first lens is on a junction surface of the first part with the second part,
the second lens is a convex lens that has a convex shape, and
the second lens is on a side of the second part opposite to the first part; and
a second optical communication connector that is detachable and attachable from and to the first optical communication connector, wherein
the second optical communication connector is capable of spatial optical coupling,
the second optical communication connector includes:
a third lens configured to collect light incident from the second lens; and
a fourth lens configured to collect light incident from the third lens at a light receiver.

15. An optical communication cable, comprising:
an optical fiber;
a first optical communication connector capable of spatial optical coupling, wherein the first optical communication connector includes:
a first lens on which shaped light is incident;
a second lens configured to collect light incident from the first lens at the optical fiber; and
a connector main body that defines relative positions of the optical fiber, the first lens, and the second lens, wherein the connector main body includes:
a first part to which the optical fiber is fixed; and
a second part that includes the first lens, wherein
the first lens is a convex lens that has a convex shape,
the first lens is on a side of the second part opposite to the first part,
the second lens is a concave lens that has a concave shape, and
the second lens is on a junction surface of the first part with the second part; and
a second optical communication connector capable of spatial optical coupling, wherein the second optical communication connector includes:
a third lens configured to magnify light incident from the optical fiber; and
a fourth lens configured to:
shape light incident from the third lens; and
output the shaped light.

16. An optical communication connector capable of spatial optical coupling, the optical communication connector comprising:
a first lens configured to magnify light emitted from a light emitter;
a second lens configured to:
magnify light incident from the first lens; and
output the magnified light incident from the first lens;
a third lens configured to:
shape light incident from the second lens; and
output the shaped light; and a connector main body that defines relative positions of the light emitter, the first lens, the second lens, and the third lens, wherein the connector main body includes:
  a first part to which the light emitter is fixed; and
  a second part that includes the third lens,
the first lens is a concave lens that has a concave shape,
the first lens is on a junction surface of the second part with the first part,
the second lens has a concave shape,
the second lens is on a junction surface of the second part with the first part,
the third lens is a convex lens that has a convex shape, and
the third lens is on a side of the second part opposite to the first part.

* * * * *